US012720952B2

(12) United States Patent
Lee et al.

(10) Patent No.: US 12,720,952 B2
(45) Date of Patent: Aug. 25, 2026

(54) DISPLAY DEVICE WITH PATTERNED INTERMEDIATE LAYER ON AUXILIARY ELECTRODE AND METHOD OF MANUFACTURING THE SAME

(71) Applicant: Samsung Display Co., Ltd., Yongin-si (KR)

(72) Inventors: Seho Lee, Yongin-si (KR); Taehyung Kim, Yongin-si (KR); Yongdae Lee, Yongin-si (KR); Jihwan Yoon, Yongin-si (KR); Sangwoo Pyo, Yongin-si (KR); Jaehoon Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 601 days.

(21) Appl. No.: 18/079,496

(22) Filed: Dec. 12, 2022

(65) Prior Publication Data

US 2023/0189547 A1 Jun. 15, 2023

(30) Foreign Application Priority Data

Dec. 13, 2021 (KR) ........................ 10-2021-0178034

(51) Int. Cl.
*H10K 50/824* (2023.01)
*H10K 59/12* (2023.01)
(Continued)

(52) U.S. Cl.
CPC ......... *H10K 50/824* (2023.02); *H10K 59/122* (2023.02); *H10K 59/1315* (2023.02);
(Continued)

(58) Field of Classification Search
CPC .... H10K 50/824; H10K 59/122; H10K 59/38; H10K 59/1315; H10K 59/1201; H10K 71/00
(Continued)

(56) References Cited

U.S. PATENT DOCUMENTS 9,780,158 B2 10/2017 Lee et al.
10,147,769 B2 12/2018 Lee et al.
(Continued)

FOREIGN PATENT DOCUMENTS

KR 10-1219386 1/2013
KR 10-1278046 6/2013
(Continued)

OTHER PUBLICATIONS

Nyeongwon Kim et al., "Process Optimization for Femtosecond Laser Hole Drilling of Silicon Wafer", Journal of Welding and Joining, Jun. 20, 2019, pp. 220-225, vol. 37, No. 3.
(Continued)

*Primary Examiner* — Eric W Jones
(74) *Attorney, Agent, or Firm* — Womble Bond Dickinson (US) LLP

(57) ABSTRACT

The disclosure provides a display device and a method of manufacturing the display device. The display device includes a first electrode disposed on an organic insulating layer and a second electrode disposed on an intermediate layer and overlapping the first electrode and an auxiliary electrode in a plan view, the second electrode electrically contacting the auxiliary electrode through a hole of the intermediate layer. A thickness of the intermediate layer varies in a direction away from a center of the hole of the intermediate layer.

32 Claims, 18 Drawing Sheets

(51) Int. Cl.
*H10K 59/122* (2023.01)
*H10K 59/131* (2023.01)
*H10K 59/38* (2023.01)
*H10K 71/00* (2023.01)

(52) U.S. Cl.
CPC ............ *H10K 59/38* (2023.02); *H10K 71/00* (2023.02); *H10K 59/1201* (2023.02)

(58) Field of Classification Search
USPC ............................................ 257/40, 59, 99
See application file for complete search history.

(56) References Cited

U.S. PATENT DOCUMENTS 10,186,680 B2 1/2019 Lee
2012/0126219 A1* 5/2012 Sato ...................... H10K 50/11 257/E51.026
2012/0252303 A1* 10/2012 Otsuka ............ H10K 59/80522 445/58
2018/0006098 A1* 1/2018 Hong ................ H10K 59/1201
2018/0006106 A1* 1/2018 Oh ...................... H10K 50/828
2018/0114818 A1* 4/2018 Paek ................... H10K 59/122
2018/0158878 A1 6/2018 Lee et al.
2019/0115561 A1 4/2019 Tang et al.
2020/0303469 A1 9/2020 Lee
2021/0257581 A1* 8/2021 Wang .................... H10K 71/00
2021/0359078 A1 11/2021 Kim et al.
2022/0375787 A1* 11/2022 Lei ..................... H01L 23/5389

FOREIGN PATENT DOCUMENTS

KR 10-2017-0015633 2/2017
KR 10-2018-0066320 6/2018
KR 10-2018-0104225 9/2018
KR 10-2122401 6/2020

OTHER PUBLICATIONS

Korean International Search Report for International Application No. PCT/KR2022/020151, dated Mar. 17, 2023.

* cited by examiner

B-OP1, EA
510
610
540
640
150
160
170
OLED1
700
600
550
500
501
430
420
410
400
170
DNL
150
109
107
105
103
101
100
A'
A
CT6
CT5
CT4
CT3
CE2b
CE2a
CE2
CE1
Cst
PC
G1
B1
C1
D1
A1
M1
CE
VDL
163
162
161
160
z
x

FIG. 12

163 162 161 BNL 180 109 107 105 103 101 100 C'

B-OP2 160H 109oe 109OP VSL VSL-A

A' C PC Cst M1 VDL A

B OP1 150

B-OP1
160
161 162 163
150
B-OP2
160H
170
BNL
180
109
107
105
103
101
100
C'
VSL
109OP
VSL_A
A'C
PC
Cst
M1
VDL
A

DISPLAY DEVICE WITH PATTERNED INTERMEDIATE LAYER ON AUXILIARY ELECTRODE AND METHOD OF MANUFACTURING THE SAME

CROSS-REFERENCE TO RELATED APPLICATION(S)

This application claims priority to and benefits of Korean Patent Application No. 10-2021-0178034 under 35 U.S.C. § 119, filed on Dec. 13, 2021, in the Korean Intellectual Property Office, the entire contents of which are incorporated herein by reference.

BACKGROUND

1. Technical Field

One or more embodiments relate to a device and a method, and, to a display device and a method of manufacturing the display device.

2. Description of the Related Art

In accordance with the rapid development of display technologies to visually express various electrical information, various display devices having excellent properties such as small thickness, less weight, and low power consumption have been introduced.

Display devices may include liquid crystal display devices, which use light of a backlight instead of emitting light itself, or light-emitting display devices including display elements by which light may be emitted. A light-emitting display device may include various display elements including an emission layer.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments relate to a device and a method, and, to a display device and a method of manufacturing the display device.

Additional aspects will be set forth in part in the description which follows and, in part, will be apparent from the description, or may be learned by practice of the embodiments of the disclosure.

A display device may include an organic insulating layer disposed on a substrate and having an opening; a first electrode disposed on the organic insulating layer; an auxiliary electrode disposed on the organic insulating layer, the auxiliary electrode having a first portion overlapping the opening of the organic insulating layer in a plan view; a bank layer including a first bank opening and a second bank opening, the first bank opening overlapping the first electrode in the plan view and the second bank opening overlapping the first portion of the auxiliary electrode in the plan view; an intermediate layer disposed on the first electrode and the auxiliary electrode, the intermediate layer including a hole exposing a portion of the auxiliary electrode; and a second electrode disposed on the intermediate layer and overlapping the first electrode and the auxiliary electrode in the plan view, the second electrode electrically contacting the auxiliary electrode through the hole of the intermediate layer, wherein a thickness of the intermediate layer varies in a direction away from a center of the hole of the intermediate layer.

The intermediate layer may further include a first area adjacent to the hole of the intermediate layer, and a second area adjacent to the first area, the second area extending to the first area and including a maximum point that is a greatest height of the intermediate layer.

A thickness of the first area may increase in a direction away from the hole of the intermediate layer.

A plane shape of at least one of the first area and the second area may be annular.

An area of a plane shape of the hole of the intermediate layer may be about 60±20% of a sum of the area of the plane shape of the hole of the intermediate layer, an area of the plane shape of the first area, and an area of the plane shape of the second area.

A radius of a plane shape of the hole of the intermediate layer, may be about 60±20% of a radius of an outer boundary of the plane shape of the second area.

A distance from a boundary of the hole of the intermediate layer to an outer boundary of the plane shape of the first area, may be about 15±10% of the radius of the outer boundary of the plane shape of the second area.

A distance from the outer boundary of a plane shape of the first area to an outer boundary of the plane shape of the second area, may be about 25±20% of a radius of the outer boundary of the plane shape of the second area.

The thickness of the intermediate layer in the first area may be about 10±5% of the thickness of the intermediate layer at an outer edge of the second area.

The thickness of the intermediate layer in the first area may be greater than or equal to about 200 Å and less than or equal to about 600 Å.

A maximum value the thickness of the intermediate layer in the second area may be about 140±20% of the thickness of the intermediate layer at an outer edge of the second area.

The intermediate layer may include an emission layer, and the hole of the intermediate layer may penetrate through the emission layer.

The display device may further include a common voltage line disposed on the substrate and extending in a direction; an auxiliary common voltage line overlapping the common voltage line in the plan view, the auxiliary common voltage line electrically connected to the common voltage line through a contact hole in at least one insulating layer disposed between the common voltage line and the auxiliary common voltage line, wherein the auxiliary common voltage line and the common voltage line may overlap the opening of the organic insulating layer in the plan view.

The display device may further include an inorganic insulating layer directly contacting an upper surface of the auxiliary common voltage line.

The first portion has a width greater than a width of the opening of the organic insulating layer; and auxiliary electrode may further include a second portion integral with the first portion and having a width less than the width of the first portion, wherein the second portion of the auxiliary electrode may be electrically connected to the auxiliary common voltage line through a contact hole penetrating through the organic insulating layer and the inorganic insulating layer.

A display device may include an organic insulating layer disposed on a substrate and having an opening; a first electrode disposed on the organic insulating layer; an auxiliary electrode disposed on the organic insulating layer, the auxiliary electrode having a first portion overlapping the opening of the organic insulating layer in a plan view; a bank layer including a first bank opening and a second bank opening, wherein the first bank opening overlapping the first electrode in the plan view and the second bank opening overlapping the first portion of the auxiliary electrode in the plan view; an intermediate layer disposed on the first electrode and the auxiliary electrode, the intermediate layer including a hole exposing a portion of the auxiliary electrode; and a second electrode disposed on the intermediate layer and overlapping the first electrode and the auxiliary electrode in the plan view, the second electrode electrically contacting the auxiliary electrode through the hole of the intermediate layer, wherein the intermediate layer may further include a first area adjacent to the hole of the intermediate layer, a first thickness of the first area varies in the first area; a second area adjacent to the first area and extended to the first area, a second thickness of the second area varying in the second area, the second thickness having a maximum point at which the intermediate layer has a greatest thickness; and a third area disposed at an outer edge of the second area, the third area having a third thickness that is uniform.

The first thickness may increase in a direction away from the hole of the intermediate layer.

A plane shape of at least one of the first area and the second area may be annular.

An area of the plane shape of the hole of the intermediate layer may be about 60±20% of a sum of the area of the plane shape of the hole of the intermediate layer, an area of the plane shape of the first area, and an area of the plane shape of the second area.

A radius of the plane shape of the hole of the intermediate layer, may be about 60±20% of a radius of an outer boundary of the plane shape of the second area.

A distance from a boundary of the hole of the intermediate layer to an outer boundary of a plane shape of the first area, may be about 15±10% of the radius of an outer boundary of a plane shape of the second area.

A distance from an outer boundary of the plane shape of the first area to an outer boundary of a plane shape of the second area, may be about 25±20% of a radius of the outer boundary of the plane shape of the second area.

The first thickness may be about 10±5% of the third thickness.

The first thickness may be greater than or equal to about 200 Å and less than or equal to about 600 Å.

A maximum value of the second thickness may be about 140±20% of the third thickness.

The intermediate layer may include an emission layer, and the hole of the intermediate layer may penetrate through the emission layer.

The display device may further include a common voltage line disposed on the substrate and extending in a direction; an auxiliary common voltage line overlapping the common voltage line in the plan view, the auxiliary common voltage line electrically connected to the common voltage line through a contact hole in at least one insulating layer disposed between the common voltage line and the auxiliary common voltage line, wherein the auxiliary common voltage line and the common voltage line may overlap the opening of the organic insulating layer in the plan view.

The display device may further include an inorganic insulating layer directly contacting an upper surface of the auxiliary common voltage line.

The auxiliary electrode may include the first portion overlapping an opening of the organic insulating layer in a plan view and having a width greater than a width of the opening of the organic insulating layer, and a second portion integral with the first portion and having a width less than the width of the first portion, wherein the second portion of the auxiliary electrode may be electrically connected to the auxiliary common voltage line through a contact hole penetrating through the organic insulating layer and the inorganic insulating layer.

A method of manufacturing a display device may include forming an organic insulating layer having an opening on a substrate; forming a first electrode on the organic insulating layer; forming an auxiliary electrode in which a first portion overlapping the opening of the organic insulating layer in a plan view on the organic insulating layer; forming a bank layer including a first bank opening and a second bank opening, the first bank opening overlapping the first electrode in the plan view and the second bank opening overlapping the first portion of the auxiliary electrode in the plan view; forming an intermediate layer on the first electrode and the auxiliary electrode; forming a hole of the intermediate layer exposing a portion of the auxiliary electrode by irradiating a laser to the intermediate layer; removing a portion of a first area of the intermediate layer around the hole of the intermediate layer and forming a second area of the intermediate layer to protrude by irradiating the laser to the intermediate layer, the second area being extended to the first area; and forming a second electrode on the intermediate layer to electrically contact the auxiliary electrode through the hole of the intermediate layer.

An output per unit area of the laser may be less than or equal to about 200 $mJ/cm^2$.

The laser may include an ultraviolet laser having a wavelength greater than or equal to about 300 nm and less than or equal to about 400 nm.

The above and other aspects, features, and advantages of embodiments will be more apparent from the following description, claims, and detailed description.

BRIEF DESCRIPTION OF THE DRAWINGS

The above and other aspects, features, and advantages will be more apparent from the following description taken in conjunction with the accompanying drawings, in which:

Figure 12:
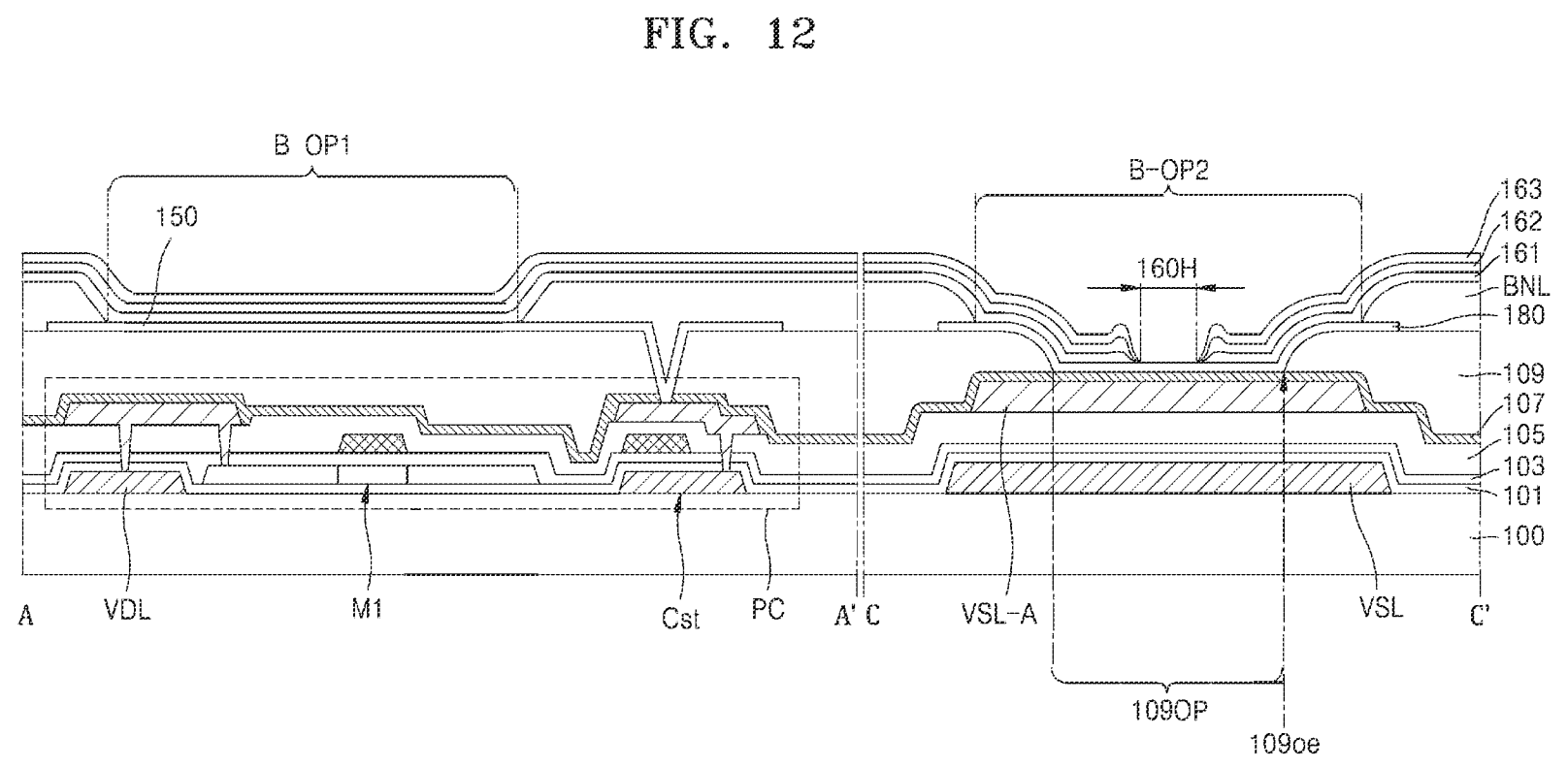

FIGS. 10 to 14 are schematic cross-sectional views according to a process of manufacturing a display device, according to an embodiment;

DETAILED DESCRIPTION OF THE EMBODIMENTS

Figure 1:
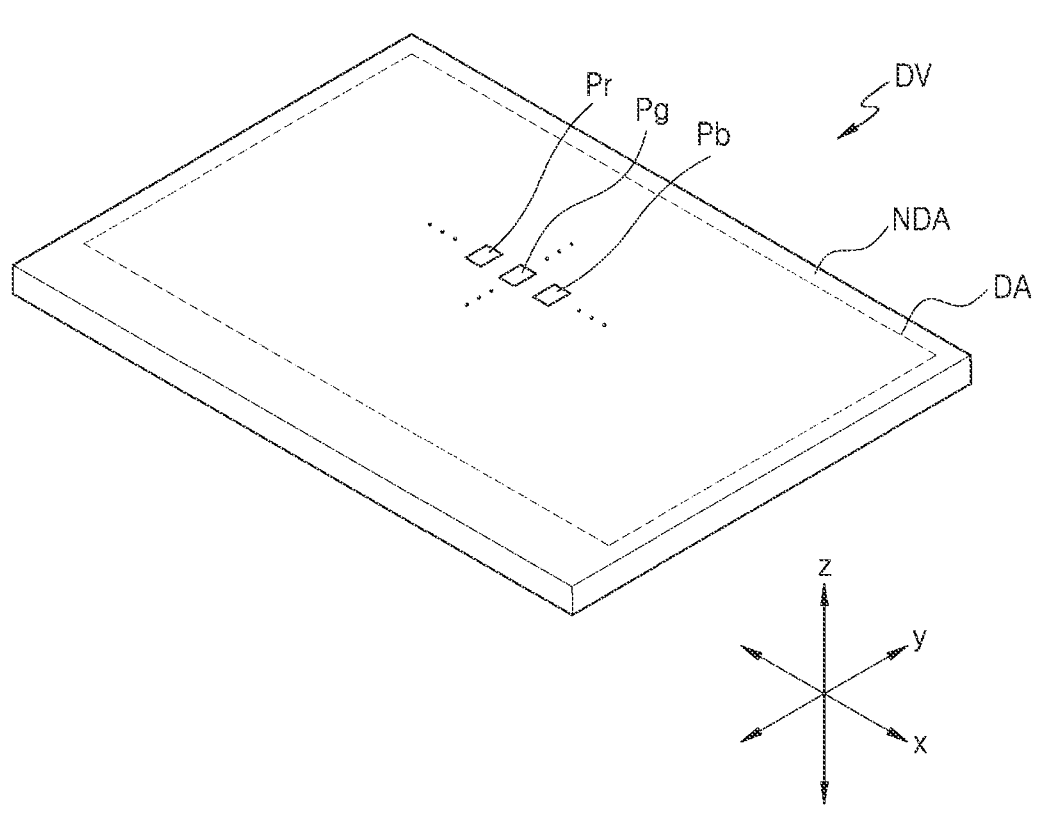
FIG. 1 is a schematic perspective view of a display device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b or c" indicates only a, only b, only c, both a and b, both a and c, both b and c, all of a, b, and c, or variations thereof.

Hereinafter, the following embodiments will be described in detail with reference to the accompanying drawings. Same reference numerals will be given to same or corresponding components in the description with reference to the accompanying drawings, and repeated descriptions thereof are omitted.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

In the following embodiments, unless obviously defined otherwise, singular forms also include plural forms. For example, as used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

In the following embodiments, when a portion such as a film, an area, or a component is on or above another portion, the portion may be directly on the other portion, and other films, areas, or components may be located therebetween.

For convenience of explanation, sizes of components in the drawings may be exaggerated. For example, as sizes and thicknesses are arbitrarily shown for convenience of explanation, the embodiments are not limited to the accompanying drawings.

When an embodiment may be implemented differently, a specific process order may be performed differently from the described order. For example, two consecutively described processes may be performed substantially at the same time or performed in an order opposite to the described order.

In the following embodiments, it will be understood that when an element such as a film, an area, or a component is referred to as being connected to another film, area, or component, the film, area, or component may be directly connected to the other film, area, or component, or may be indirectly connected with another film, area, or component therebetween. For example, when an element such as a film, an area, or a component is electrically connected to another element, the film, area, or component may be directly connected to the other film, area, or component, or may be indirectly connected to the other film, area, or component with an intervening film, area, or component therebetween.

It will be understood that the terms "connected to" or "coupled to" may include a physical or electrical connection or coupling.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display device according to an embodiment.

Referring to FIG. 1, a display device DV may include a display area DA and a non-display area NDA outside the display area DA. The display device DV may provide an image through an array of pixels two-dimensionally arranged (or disposed) on an x-y plane in the display area DA. The pixels include a first pixel, a second pixel, and a third pixel, and hereinafter, for convenience of explanation, an example in which the first pixel is a red pixel Pr, the second pixel is a green Pixel Pg, and the third pixel is a blue pixel Pb will be described.

The red pixel Pr, the green pixel Pg, and the blue pixel Pb are areas, from which red, green, and blue light may be emitted, respectively, and the display device DV may provide images by using the light emitted from the red Pixel Pr, the green pixel Pg, and the blue pixel Pb.

The non-display area NDA, which is an area that does not provide an image, may surround or may be adjacent to the entire portion of the display area DA. A driver or a main voltage line to provide electric signals or power to pixel circuits may be arranged in the non-display area NDA. The non-display area NDA may include a pad, to which electric devices or a printed circuit board may be electrically connected.

As shown in FIG. 1, the display area DA may have a polygon shape, including a rectangle. For example, the display area DA may have a rectangular shape in which a horizontal length is greater than a vertical length, a rectangular shape in which a horizontal length is smaller than a vertical length, or a square shape. For example, the display area DA may have various shapes such as an ellipse or a circle.

Figure 2:
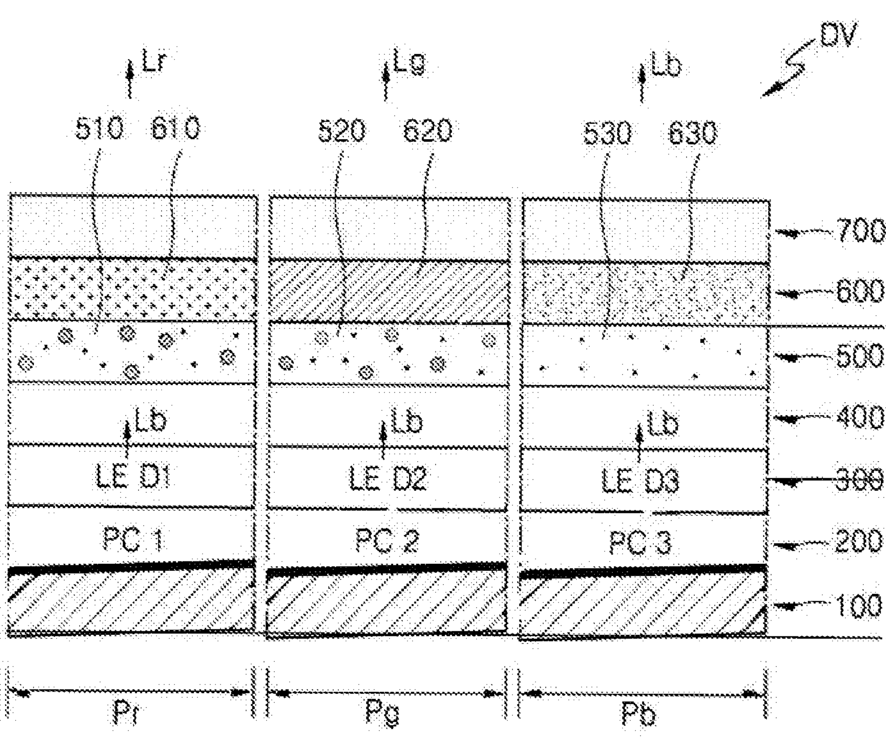
FIG. 2 is a schematic cross-sectional view of each pixel in a display device according to an embodiment.

FIG. 2 is a schematic cross-sectional view of each pixel in the display device DV according to an embodiment.

Referring to FIG. 2, the display device DV may include a circuit layer 200 on the substrate 100. The circuit layer 200 may include a first pixel circuit PC1, a second pixel circuit PC2, and a third pixel circuit PC3, which may be electrically connected to a first light-emitting diode LED1, a second light-emitting diode LED2, and a third light-emitting diode LED3 in a light-emitting diode layer 300, respectively.

The first light-emitting diode LED1, the second light-emitting diode LED2, and the third light-emitting diode LED3 may include organic light-emitting diodes including organic materials. According to an embodiment, the first light-emitting diode LED1, the second light-emitting diode LED2, and the third light-emitting diode LED3 may include inorganic light-emitting diodes including inorganic materials. The inorganic light-emitting diode may include a p-n junction diode including inorganic semiconductor-based materials. In case that a voltage is applied in a positive direction to the p-n junction diode, holes and electrons are injected into the p-n junction diodes, and light having certain colors may be emitted by converting energy, which is generated by re-combination of the holes and electrons, into light energy. The above-described inorganic light-emitting diode may have a width from several micrometers to hundreds of micrometers or from several nanometers to hundreds of nanometers. In an embodiment, a light-emitting diode (LED) may include a LED including quantum dots. As described above, an emission layer of the LED may include an organic material, an inorganic material, quantum dots, an organic material and quantum dots, or an inorganic material and quantum dots.

The first light-emitting diode LED1, the second light-emitting diode LED2, and the third light-emitting diode LED3 may emit light having a same color. For example, light (for example, blue light Lb) emitted from the first light-emitting diode LED1, the second light-emitting diode LED2, and the third light-emitting diode LED3 may pass through a color conversion-transmission layer 500 via an encapsulation layer 400 on the light-emitting diode layer 300.

The color conversion-transmission layer 500 may include optical units to transmit the light (for example, the blue light Lb), which is emitted from the light-emitting diode layer 300, with or without color conversion. For example, the color conversion-transmission layer 500 may include color conversion units to convert the light (for example, the blue light Lb), which is emitted from the light-emitting diode layer 300, into light having another color, and a transmission unit to transmit the light (for example, the blue light Lb), which is emitted from the light-emitting diode layer 300 without color conversion. The color conversion-transmission layer 500 may include a first color conversion unit 510 corresponding to the red pixel Pr, a second color conversion unit 520 corresponding to the green pixel Pg, and a transmission unit 530 corresponding to the blue pixel Pb. The first color conversion unit 510 may convert the blue light Lb into red light Lr, and the second color conversion unit 520 may convert the blue light Lb into green light Lg. The transmission layer 530 may transmit the blue light Lb without color conversion.

A color layer 600 may be disposed on the color conversion-transmission layer 500. The color layer 600 may have a first color filter 610, a second color filter 620, and a third color filter 630 respectively having different colors. For example, the first color filter 610 may include a red color filter, the second color filter 620 may include a green color filter, and the third color filter 630 may include a blue color filter.

Color purity of color-converted light and transmitted light from the color-conversion transmission layer 500 may be improved while passing through the first color filter 610, the second color filter 620, and the third color filter 630. The color layer 600 may prevent or minimize external light (for example, light incident to the display device DV from outside the display device DV) from being reflected and recognized by the user.

A light-transmitting base layer 700 may be provided on the color layer 600. The light-transmitting base layer 700 may include glass or light-transmitting organic materials.

For example, the light-transmitting base layer 700 may include a light-transmitting organic material such as an acryl-based resin.

According to an embodiment, the light-transmitting base layer 700 is a kind of substrate, and after the color layer 600 and the color conversion-transmission layer 500 are formed above the light-transmitting base layer 700, the light-transmitting base layer 700 may be integral with the color layer 600 and the color conversion-transmission layer 500 such that the color conversion-transmitting layer 500 faces the encapsulation layer 400.

According to an embodiment, after the color conversion-transmission layer 500 and the color layer 600 are sequentially formed on the encapsulation layer 400, the light-transmitting base layer 700 may be formed by being coated and cured on or directly on the color layer 600. According to an embodiment, another optical film, for example, an anti-reflection (AR) film, may be disposed on the light-transmitting base layer 700.

The display device DV having the structure described above may include a television, a billboard, a theater screen, a monitor, a tablet PC, a notebook computer, and the like within the spirit and the scope of the disclosure.

Figure 3:
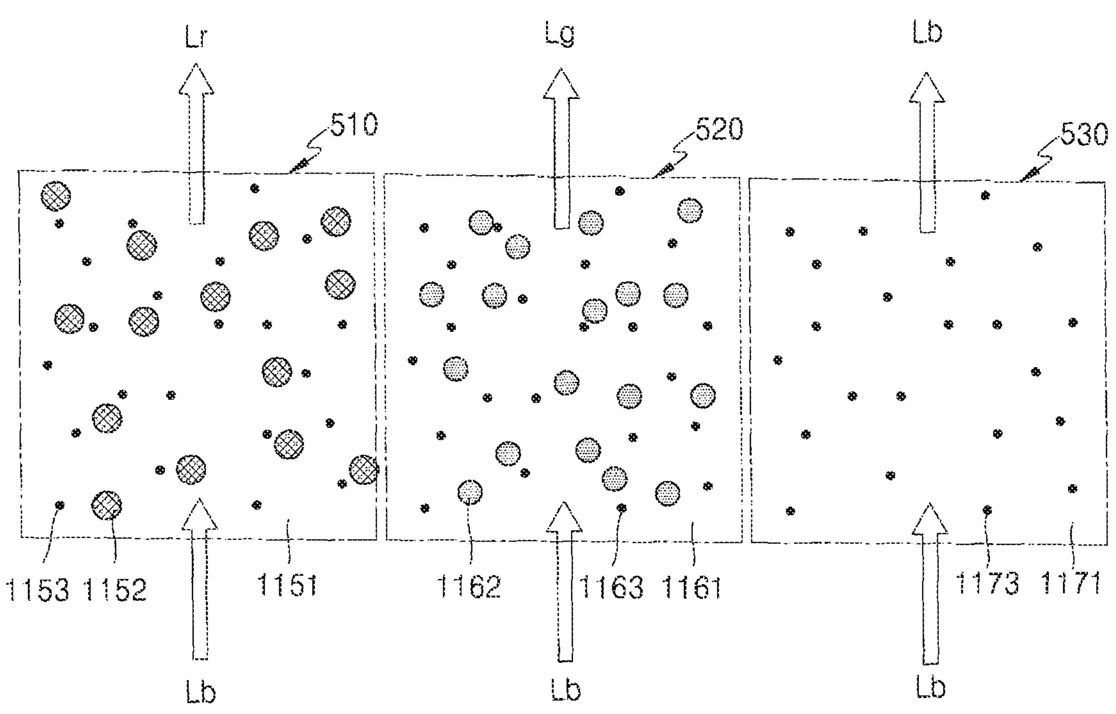
FIG. 3 illustrates schematic cross-sectional views of optical units in a color-conversion-transmission layer shown in FIG. 2.

FIG. 3 illustrates schematic cross-sectional views of optical units in the color-conversion transmission layer shown in FIG. 2.

Referring to FIG. 3, the first color conversion unit 510 may convert the blue light Lb, which is incident to the first color conversion unit 510, into the red light Lr. As shown in FIG. 3, the first color conversion unit 510 may include a first photosensitive polymer 1151, and first quantum dots 1152 and first scattering particles 1153 dispersed in the first photosensitive polymer 1151.

The first quantum dots 1152 may be excited by the blue light Lb and may isotropically emit the red light Lr having a wavelength longer than a wavelength of the blue light Lb. The first photosensitive polymer 1151 may include an organic material having light transmittance. The first scattering particles 1153 may scatter the blue light Lb that is not absorbed by the first quantum dots 1152 such that more of the first quantum dots 1152 are excited, thereby increasing color conversion efficiency. The first scattering particles 1153 may include, for example, titanium dioxide ($TiO_2$) or metal particles. The first quantum dots 1152 may be selected from among a Group II-VI compound, a Group III-V compound, a Group IV-VI compound, a Group IV element, a Group IV compound, and a combination thereof.

The second color conversion unit 520 may convert the blue light Lb, which is incident to the second color conversion unit 520, into the green light Lg. As shown in FIG. 3, the second color conversion unit 520 may include a second photosensitive polymer 1161, and second quantum dots 1162 and second scattering particles 1163 dispersed in the second photosensitive polymer 1161.

The second quantum dots 1162 may be excited by the blue light Lb and may isotropically emit the green light Lg having a wavelength longer than the wavelength of the blue light Lb. The second photosensitive polymer 1161 may include an organic material having light transmittance.

The second scattering particles 1163 may scatter the blue light Lb that is not absorbed by the second quantum dots 1162 such that more of the second quantum dots 1162 are excited, thereby increasing color conversion efficiency. The second scattering particles 1163 may include, for example, $TiO_2$ or metal particles. The second quantum dots 1162 may be selected from a Group II-VI compound, a Group III-V compound, a Group IV-VI compound, a Group IV element, a Group IV compound, and a combination thereof.

According to an embodiment, the first quantum dots 1152 may include a same material or a similar material as a material of the second quantum dots 1162. A size of the first quantum dots 1152 may be greater than a size of the second quantum dots 1162.

The transmitting unit 530 may transmit the blue light Lb without converting the blue light Lb incident to the transmitting unit 530. As shown in FIG. 3, the transmitting unit 530 may include a third photosensitive polymer 1171 in which third scattering particles 1173 are dispersed. The third photosensitive polymer 1171 may include an organic material having light transmittance, for example, silicon resin, epoxy resin, and the like, and may include a same material or a similar material as the material of the first photosensitive polymer 1151 and the second photosensitive polymer 1161. The third scattering particles 1173 may scatter the blue light Lb and emit the scattered blue light Lb, and may include a same material or a similar material as the material of the first scattering particles 1153 and the second scattering particles 1163.

Figure 4:
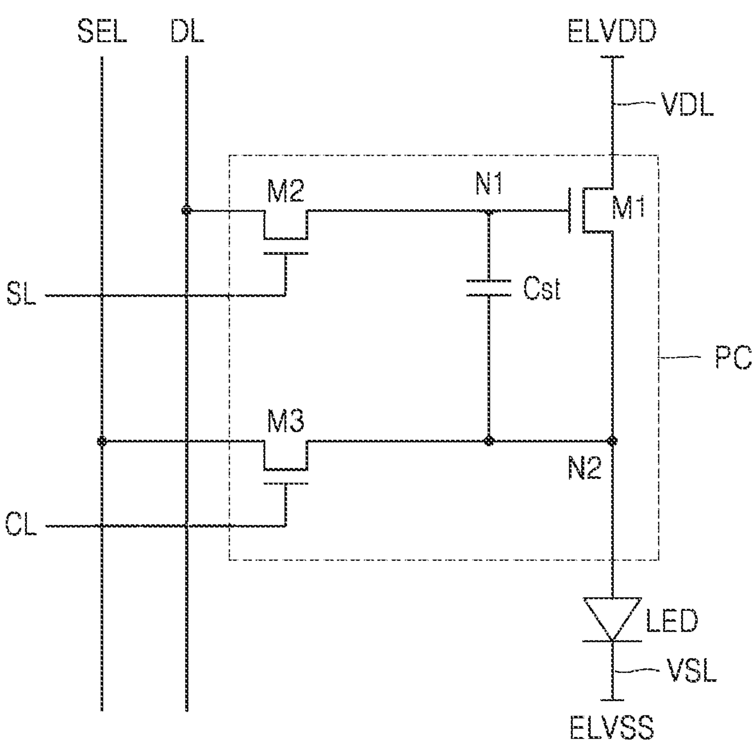
FIG. 4 is a schematic diagram of an equivalent circuit of a light-emitting diode and a pixel circuit electrically connected thereto, which are included in a display device, according to an embodiment.

FIG. 4 is a schematic diagram of an equivalent circuit of a light-emitting diode and a pixel circuit electrically connected thereto, which are included in the display device, according to an embodiment Referring to FIG. 4, the light-emitting diode, for example, a first electrode (for example, an anode) of the light-emitting diode LED is connected to a pixel circuit PC, and a second electrode (for example, a cathode) of the light-emitting diode LED may be connected to a common voltage line VSL to provide a common power voltage ELVSS. The light-emitting diode LED may emit light having a luminance corresponding to an amount of current provided from the pixel circuit PC.

The light-emitting diode LED shown in FIG. 4 may correspond to each of the first light-emitting diode LED1, the second light-emitting diode LED2, and the third light-emitting diode LED3 shown in FIG. 2, and the pixel circuit PC shown in FIG. 4 may correspond to each of the first pixel circuit PC1, the second pixel circuit PC2, and the third pixel circuit PC3 shown in FIG. 2.

The pixel circuit PC may control an amount of current flowing from a driving power voltage ELVDD to the common power voltage ELVSS through the light-emitting diode LED, in response to a data signal. The pixel circuit PC may include a driving transistor M1, a switching transistor M2, a sensing transistor M3, and a storage capacitor Cst.

Each of the driving transistor M1, the switching transistor M2, and the sensing transistor M3 may include an oxide semiconductor thin-film transistor, which may include a semiconductor layer including an oxide semiconductor, or a silicon semiconductor thin-film transistor including a semiconductor layer including polysilicon. According to a type of the transistor, a first electrode may include one of a source electrode and a drain electrode, and a second electrode may include another one of the source electrode and the drain electrode.

A first electrode of the driving transistor M1 is connected to a driving voltage line VDL to provide the driving power voltage, and the second electrode may be connected to a first electrode of the light-emitting diode LED. A gate electrode of the driving transistor M1 may be connected to a first node N1. The driving transistor M1 may control an amount of current flowing from the driving power voltage ELVDD through the light-emitting diode LED, in response to a voltage of the first node N1.

The switching transistor M2 may include a switching transistor. A first electrode of the switching transistor M2 may be connected to a data line DL, and a second electrode of the switching transistor M2 may be connected to the first node N1. A gate electrode of the switching transistor M2 may be connected to a scan line SL. The switching transistor M2 may be turned on in case that a scan signal is provided to the scan line SL, and may electrically connect the data line DL to the first node N1.

The sensing transistor M3 may include an initializing transistor and/or a sensing transistor. A first electrode of the sensing transistor M3 may be connected to a second node N2, and a second electrode of the sensing transistor M3 may be connected to a sensing line SEL. A gate electrode of the sensing transistor M3 may be connected to a control line CL.

The storage capacitor Cst may be connected between the first node N1 and the second node N2. For example, a first capacitor electrode of the storage capacitor Cst may be connected to the gate electrode of the driving transistor M1, and a second capacitor electrode of the storage capacitor Cst may be connected to the first electrode of the light-emitting diode LED.

Although FIG. 4 illustrates the driving transistor M1, the switching transistor M2, and the sensing transistor M3 as an N-channel metal oxide semiconductor (NMOS), the embodiment is not limited thereto. For example, at least one of the driving transistor M1, the switching transistor M2, and the sensing transistor M3 may be formed into a P-channel metal oxide semiconductor (PMOS).

Although FIG. 4 illustrates three transistors, the embodiment is not limited thereto. The pixel circuit PC may include four or more transistors.

Figure 5:
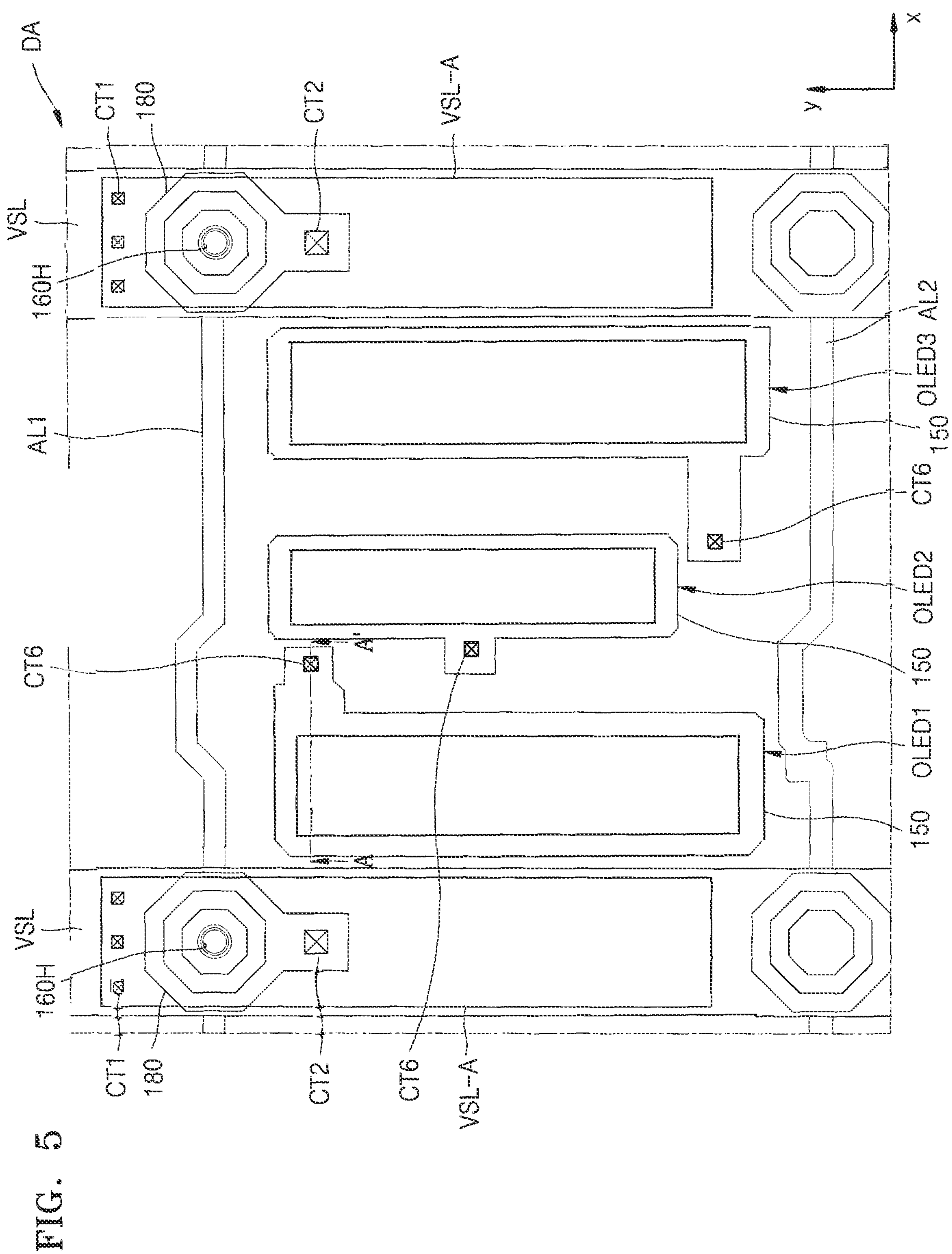
FIG. 5 is a schematic top-plan view of light-emitting diodes of the display device and distributions disposed around the light-emitting diodes, according to an embodiment.

FIG. 5 is a schematic top-plan view of light-emitting diodes of the display device and distributions disposed around the light-emitting diodes, according to an embodiment.

Referring to FIG. 5, the common voltage lines VSL may be arranged in the display area DA, and each of the common voltage lines VSL may extend in the y direction. The common voltage lines VSL are arranged apart from each other, and light-emitting diodes, for example, organic light-emitting diodes may be arranged between two common voltage lines VSL adjacent to each other. According to an embodiment, FIG. 5 illustrates that a first light-emitting diode OLED1, a second light-emitting diode OLED2, and a third light-emitting diode OLED3 are arranged between two common voltage lines VSL adjacent to each other.

Auxiliary lines extending in a direction (for example, the x direction) orthogonal to the common voltage line VSL may be arranged in the display area DA. According to an embodiment, FIG. 5 illustrates that a first auxiliary line AL1 and a second auxiliary line AL2 extend in the x direction, and the first auxiliary line AL1 and the second auxiliary line AL2 may be apart from each other having the first light-emitting diode OLED1, the second light-emitting diode OLED2, and the third light-emitting diode OLED3 therebetween. Each of the common voltage lines VSL may be electrically connected to at least one of the first auxiliary line AL1 and the second auxiliary line AL2.

FIG. 5 illustrates a structure of a portion of the display area DA, and the display area DA may be considered as an area in which the structure shown in FIG. 5 is repeatedly arranged. For example, in the display area DA, common voltage lines VSL and auxiliary lines are electrically connected to each other while crossing with each other, and in a schematic top-plan view, the common voltage lines VSL and the auxiliary lines may form a mesh structure. In case that the display area DA has a relatively large area, a voltage drop in the common voltage provided through the common voltage line VSL may be caused. The common voltage lines VSL and the auxiliary lines may form the mesh structure in a schematic top-plan view, and by doing so, the voltage drop described above may be prevented or reduced as much as possible.

The auxiliary electrode 180 may be arranged to overlap a portion of the common voltage line VSL. The auxiliary electrode 180 may be electrically connected to the common voltage line VSL by using a first contact hole CT1 and a second contact hole CT2, and may receive power from the common voltage line VSL. Second electrodes (for example, cathodes) of the light-emitting diodes, for example, the first organic light-emitting diode OLED1, the second organic light-emitting diode OLED2, and the third organic light-emitting diode OLED3, may be electrically connected to the common voltage line VSL through the auxiliary electrode 180.

The common voltage line VSL may be electrically connected to an auxiliary common voltage line VSL-A arranged to overlap the common voltage line VSL. For example, the auxiliary common voltage line VSL-A may contact the common voltage line VSL through the second contact hole CT2.

The first electrode 150 (for example, anodes) of each of the light-emitting diodes, for example, the first organic light-emitting diode OLED1, the second organic light-emitting diode OLED2, and the third organic light-emitting diode OLED3, may be electrically connected to a pixel circuit disposed thereunder through a sixth contact hole CT6. The pixel circuit connected to each of the first organic light-emitting diode OLED1, the second organic light-emitting diode OLED2, and the third organic light-emitting diode OLED3 may include transistors and a storage capacitor, as described above with reference to FIG. 4.

Figure 6:
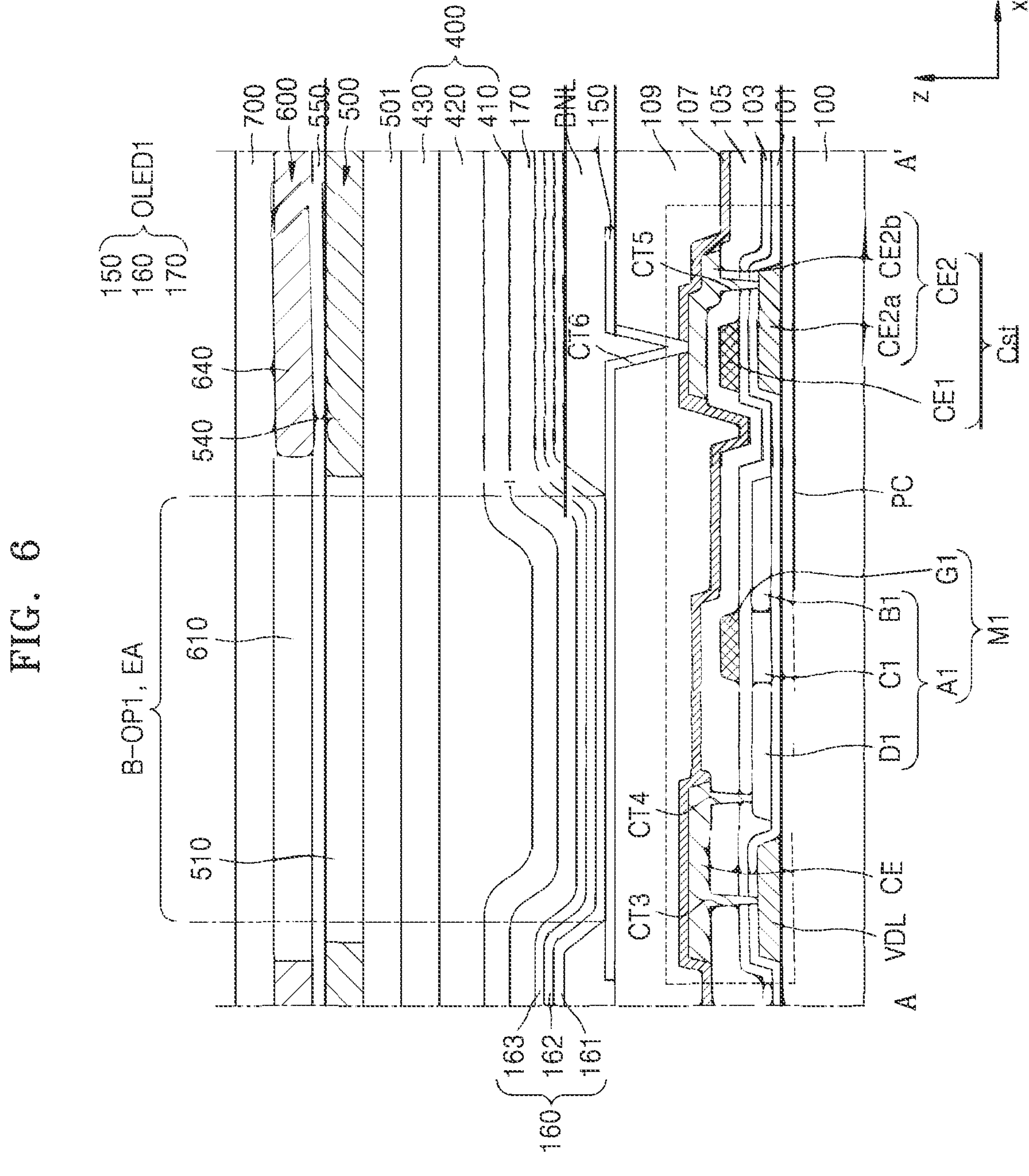
FIG. 6 is a schematic cross-sectional view taken along line A-A' shown in FIG. 5.

FIG. 6 is a schematic cross-sectional view taken along line A-A' shown in FIG. 5.

Referring to FIG. 6, the light-emitting diode, for example, the first light-emitting diode OLED1, may be disposed above the substrate 100, and the pixel circuit PC may be located (or disposed) between the substrate 100 and the first organic light-emitting diode OLED1. In this regard, FIG. 6 illustrates the driving transistor M1 and the storage capacitor Cst included in the pixel circuit PC. Although not shown in FIG. 6, the second organic light-emitting diode OLED2 and a pixel circuit connected thereto and the third organic light-emitting diode OLED3 and a pixel circuit connected thereto may also include a same structure as the pixel circuit PC shown in FIG. 6.

The substrate 100 may include a material such as glass, a metal, or an organic material. For example, the substrate 100 may include glass, which contains $SiO_2$ as a main component, or various kinds of flexible or bendable materials, for example, a polymer resin.

The driving transistor M1 may include a semiconductor layer A1 and a gate electrode G1. The semiconductor layer A1 may include an oxide-base material or a silicon-based material (for example, amorphous silicon or polysilicon). For example, the semiconductor layer A1 may include an oxide of at least one material selected from among indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The semiconductor layer A1 may include a channel area C1, and a first low-resistance area B1 and a second low-resistance area D1 respectively arranged at two sides of the channel area C1 having the channel area C1 therebetween. The first low-resistance area B1 and the second low-resistance area D1 are areas having a resistance lower than a resistance of the channel area C1. Any one of the first low-resistance area B1 and the second low-resistance area D1 may correspond to a source area, and another one may correspond to a drain area.

The semiconductor layer A1 may be disposed on a first insulating layer 101 on the substrate 100. The first insulating layer 101 may prevent permeation of impurities into the semiconductor layer A1. The first insulating layer 101 may include an inorganic insulating material such as silicon nitride, silicon oxide, and/or silicon oxynitride.

A second insulating layer 103 may be located between the semiconductor layer A1 and the gate electrode G1. The second insulating layer 103 may include a kind of gate insulating layer, and may include an inorganic insulating material such as silicon nitride, silicon oxide, and/or silicon oxynitride.

The gate electrode G1 may overlap the channel area C1 of the semiconductor layer A1. The gate electrode G1 may include molybdenum (Mo), copper (Cu), titanium (Ti), and the like, and may include a single-layer or a multi-layer structure including the above-stated materials.

Any one of the first low-resistance area B1 and the second low-resistance area D1 of the semiconductor layer A1 may be electrically connected to the driving voltage line VDL. The driving voltage line VDL may be disposed under or below the first insulating layer 101. FIG. 6 illustrates that the driving voltage line VDL contacts the second low-resistance area D1 through a connection electrode CE on a third insulating layer 105.

The driving voltage line VDL may include a metal material such as Mo, Cu, Ti, and the like within the spirit and the scope of the disclosure. For example, the driving voltage line VDL may include a stack structure, which may include a titanium layer (a lower layer) and a copper layer (an upper layer) having a thickness greater than a thickness of the titanium layer. According to an embodiment, the driving voltage line VDL may include a multi-layer structure, which may include one or more metal layers including the above-stated metal materials and a transparent conductive oxide layer such as indium tin oxide (ITO) disposed on the one or more metal layers. The third insulating layer 105 may include an inorganic insulating material such as silicon nitride, silicon oxide, and/or silicon oxynitride.

In case that the second low-resistance area D1 is the source area (or the drain area), the connection electrode CE may be the source electrode (or the drain electrode) of the driving thin transistor M1, and in case that the second low-resistance area D1 is the drain area (or the source area), the connection electrode CE may be the drain electrode (or the source electrode) of the driving transistor M1. The connection electrode CE may contact the driving voltage line VDL through the contact hole CT3 penetrating through the first insulating layer 101, the second insulating layer 103, and the third insulating layer 105, and may contact a portion (for example, the second low-resistance area D1) of the semiconductor layer A1 of the driving transistor M1 through a fourth contact hole CT4 penetrating through the second insulating layer 103 and the third insulating layer 105. The connection electrode CE may include a metal material such as Mo, Cu, Ti, or the like within the spirit and the scope of the disclosure. For example, the connection electrode CE may include a multi-layer structure including a Ti layer and a Cu layer. According to an embodiment, the connection electrode CE may include a multi-layer structure, which may include one or more metal layer including the above-stated materials and a transparent conductive oxide layer such as ITO disposed on the one or more metal layers.

The storage capacitor Cst may include a first capacitor electrode CE1 and a second capacitor electrode CE2 overlapping the first capacitor electrode CE1, with at least one insulating layer between the first capacitor electrode CE1 and the second capacitor electrode CE2. The first capacitor electrode CE1 is formed on a same layer as the gate electrode G1 and may include a same material or a similar material as the gate electrode G1. The first capacitor electrode CE1 may include Mo, Cu, Ti, and the like, and may include a single layer or a multi-layer structure including the above-mentioned materials.

In an embodiment, the second capacitor electrode CE2 may include two sub capacitor electrodes CE2*a* and CE2*b* respectively disposed under or below and on the first capacitor electrode CE1. One sub capacitor electrode (hereinafter, referred to as a first sub capacitor electrode CE2*a*) of the sub capacitor electrodes CE2*a* and CE2*b* may be located between the substrate 100 and the first insulating layer 101, and another sub capacitor electrode (hereinafter, referred to as a second sub capacitor electrode CE2*b*) may be disposed on the third insulating layer 105.

Each of the first sub capacitor electrode CE2*a* and the second sub capacitor electrode CE2*b* may include Mo, Cu, Ti, and the like and may include a single layer or multi-layer structure including the above-mentioned materials. According to an embodiment, the first sub capacitor electrode CE2*a* may be located on a same layer as the driving voltage line VDL, and may include a same material or a similar material as the driving voltage line VDL.

The second sub capacitor electrode CE2*b* may contact the first sub capacitor electrode CE2*a* through a fifth contact hole CT5 penetrating through the first insulating layer 101, the second insulating layer 103, and the fifth insulating layer 105. A capacitance may be generated between the first sub capacitor electrode CE2*a* and the first capacitor electrode CE1 overlapping each other having the first insulating layer 101 and the second insulating layer 103 therebetween, and a capacitance may be generated between the first capacitor electrode CE1 and the second sub capacitor electrode CE2*b* overlapping each other having the third insulating layer 105 therebetween. Like this, as the second capacitor electrode CE2 may include the sub capacitor electrodes, the capacitance of the storage capacitor Cst may increase.

A fourth insulating layer 107 is disposed on the pixel circuit PC including the driving transistor M1 and the storage capacitor Cst. The fourth insulating layer 107 may include an inorganic insulating material such as silicon nitride, silicon oxide, and/or silicon oxynitride. The fourth insulating layer 107 may include a distribution, which may include a metal (for example, Cu and the like) that may be damaged by an etchant in a process of manufacturing the display device, from being exposed to an etching environment.

A fifth insulating layer 109 may be disposed on the fourth insulating layer 107 and may include an organic insulating material. The fifth insulating layer 109 may include an organic insulating material such as acryl, benzocyclobutene (BCB), polyimide, or hexamethyldisiloxane (HMDSO).

A first electrode 150 of a light-emitting diode is formed on the fifth insulating layer 109, and in this regard, FIG. 6 illustrates the first electrode 150 of the first organic light-emitting diode OLED 1.

The first electrode 150 may contact the pixel circuit PC, for example, the second sub capacitor electrode CE2*b* of the storage capacitor Cst, through the sixth contact hole CT6 penetrating through the fourth insulating layer 107 and the fifth insulating layer 109.

The first electrode 150 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the first electrode 150 may include a reflective film including silver (Ag), magnesium (Mg), aluminum (A1), platinum (Pt), palladium (Pd), gold (Au), nickel (Ni), neodymium (Nd), iridium (Ir), chromium (Cr), or a compound thereof. According to an embodiment, the first electrode 150 may further include a film including ITO, IZO, ZnO, or $In_2O_3$ on/under or below the reflective film. For example, the first electrode 150 may have a three-layer stack structure of ITO/Ag/ITO.

A bank layer BNL may cover or overlap an edge of the first electrode 105, and may include a first bank opening B-OP1 overlapping a center of the first electrode 150. The bank layer BNL may include an organic insulating material such as polyimide.

An intermediate layer 160 may contact the first electrode 150 through the first bank opening B-OP1 of the bank layer BNL. A stack structure of the first electrode 150, the intermediate layer 160, and a second electrode 170, located in the first bank opening B-OP1, may emit light having a certain color. The first bank opening B-OP1 of the bank layer BNL may correspond to an emission area EA to emit light. For example, a size (or a width) of the first bank opening B-OP1 of the bank layer BNL may correspond to a size (or a width) of the emission area EA.

The intermediate layer 160 may include an emission layer 162. The emission layer 162 may include a high molecular organic material or a low molecular organic material that emits light having a certain color. As described above with reference to FIG. 2, in case that a light-emitting diode layer 300 (see FIG. 2) emits blue light, the emission layer 162 may include a high molecular organic material or a low molecular organic material emitting blue light.

The intermediate layer 160 may further include at least one function layer. According to an embodiment, as shown in FIG. 6, the intermediate layer 160 may further include a first function layer 161 under or below the emission layer 162 and/or a second function layer 163 on the emission layer 162. The first function layer 161 may be located between the first electrode 150 and the emission layer 162, and the second function layer 163 may be located between the emission layer 162 and the second electrode 170 to be described later.

The first function layer 161 may include a hole transport layer (HTL) and/or a hole injection layer (HIL). The second function layer 163 may include an electron transport layer (ETL) and/or an electron injection layer (EIL).

The second electrode 170 may include a conductive material having a small work function. For example, the second electrode 170 may include a (semi)transparent layer including Ag, Mg, A1, Pt, Pd, Au, Ni, Nd, Ir, Cr, lithium (Li), calcium (Ca), or an alloy thereof. For example, the second electrode 170 may further include a layer such as ITO, IZO, ZnO, or $In_2O_3$ on the (semi)transparent layer including the above-mentioned materials.

The encapsulation layer 400 may be disposed on the second electrode 170. The encapsulation layer 400 may include at least one inorganic encapsulation layer and at least one organic encapsulation layer. For example, FIG. 6 illustrates that the encapsulation layer 400 may include a first inorganic encapsulation layer 410, a second inorganic encapsulation layer 430, and an organic encapsulation layer 420 between the first inorganic encapsulation layer 410 and a second inorganic encapsulation layer 430.

The first inorganic encapsulation layer 410 and the second inorganic encapsulation layer 430 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride.

The organic encapsulation layer 420 may include a polymer-based material. The polymer-based material may include an acryl-based resin, an epoxy-based resin, polyimide, polyethylene, and the like within the spirit and the scope of the disclosure. For example, the organic encapsulation layer 420 may include an acryl-based material, for example, polymethylmethacrylate, polyacrylic acid, and the like within the spirit and the scope of the disclosure. The organic encapsulation layer 420 may be formed by curing a monomer or coating a polymer.

An intermediate material layer 501 may be disposed on the encapsulation layer 400. The intermediate material layer 501 may include an inorganic insulating material and/or an organic insulating material. The color conversion-transmission layer 500 is located on the intermediate material layer 501. In this regard, FIG. 6 illustrates a light-shielding unit 540 of the color conversion-transmission layer 500 and the first color conversion unit 510 located in an opening area that is defined by the light-shielding unit 540.

A barrier layer 550 may be formed on the color conversion-transmission layer 500. The barrier layer 550 may include an inorganic insulating material such as silicon oxide, silicon nitride, and/or silicon oxynitride.

A color layer 600 may be disposed on the color conversion-transmission layer 500. In this regard, FIG. 6 illustrates a light-shielding unit 640 of the color layer 600 and a first color filter 610 located in an opening area that is defined by the light-shielding unit 640. The light-shielding unit (hereinafter, referred to as a first light-shielding unit) 540 of the color conversion-transmission layer 500 and the light-shielding unit (hereinafter, referred to as a second light-shielding unit) 640 of the color layer 600 are arranged to overlap each other.

Each of the first light-shielding unit 540 and the second light-shielding unit 640 may include a light-shielding material. For example, each of the first light-shielding unit 540 and the second light-shielding unit 640 may include an organic material having a certain color, for example, black. For example, each of the first light-shielding unit 540 and the second light-shielding unit 640 may include a polyimide (PI)-based binder and a pigment that is a mixture of red, green, and blue. For example, each of the first light-shielding unit 540 and the second light-shielding unit 640 may include a cardo-based binder resin and a mixture of a lactam black pigment and a blue pigment. For example, each of the first light-shielding unit 540 and the second light-shielding unit 640 may include carbon black.

According to an embodiment, the first light-shielding unit 540 and the second light-shielding unit 640 may include a same material or a similar material. According to an embodiment, the second light-shielding unit 640 may include a structure in which at least two of the color filters included in the color filter 600 overlap one another. For example, the second light-shielding unit 640 may not include the light-shielding material described above, and may have a stack structure of two or three color filter materials selected from among the first color filter 610, the second color filter 620, and the third color filter 630 (see FIG. 2).

The light-transmitting base layer 700 may include glass or light-transmitting organic materials. For example, the light-transmitting base layer 700 may include a light-transmitting organic material such as an acryl-based resin.

Figure 7A:
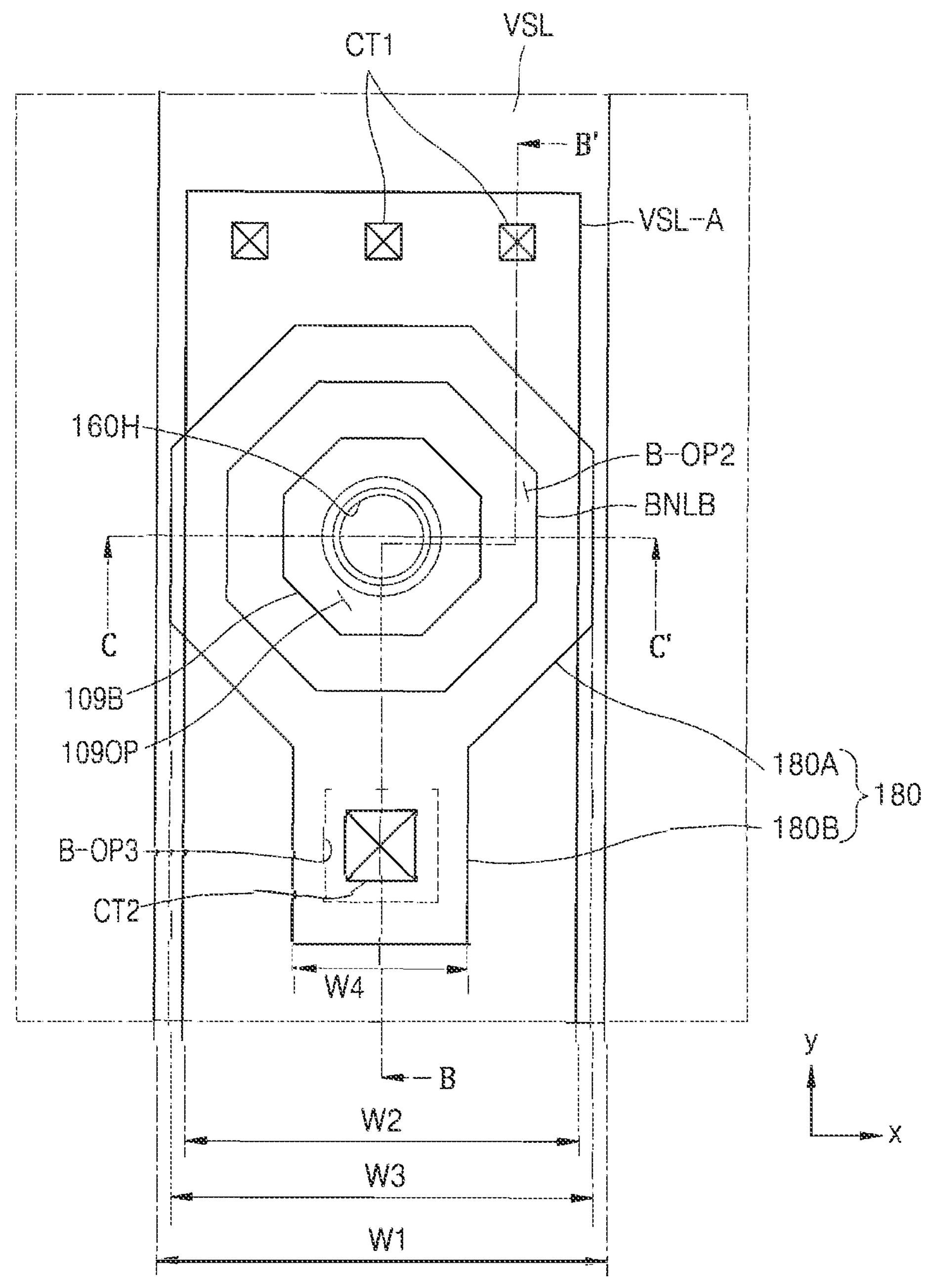
FIG. 7A is a schematic top-plan view of structures of a common voltage line and an auxiliary electrode of a display device, according to an embodiment.

FIG. 7A is a schematic top-plan view of a structure of the common voltage line and the auxiliary electrode of the display device according to an embodiment, and may correspond to an enlarged schematic top-plan view of a portion shown in FIG. 5.

Referring to FIGS. 5 and 7A, the common voltage line VSL extending in they direction may overlap the auxiliary electrode 180 and the auxiliary common voltage line VSL-A. A length (a length in the y direction) of the auxiliary common voltage line VSL-A may be smaller than a length (a length in the y direction) of the common voltage line VSL. A width (a width in the x direction) W2 of the auxiliary common voltage line VSL-A may be different from a width W1 of the common voltage line VSL. According to an embodiment, the width W2 of the auxiliary common voltage line VSL-A may be smaller than the width W1 of the common voltage line VSL.

The common voltage line VSL and the auxiliary common voltage line VSL-A, which are respectively arranged on different layers, may contact each other through the first contact hole CT1 that penetrates an insulating layer located between the common voltage line VSL and the auxiliary common voltage line VSL-A, and therefore, a resistance of the common voltage line VSL may be reduced.

The auxiliary electrode 180 is disposed above the common voltage line VSL and the auxiliary common voltage line VSL-A. The auxiliary electrode 180 may overlap the common voltage line VSL and/or the auxiliary common voltage line VSL-A. The auxiliary electrode 180 may have a plane shape different from plane shapes of the common voltage line VSL and the auxiliary common voltage line VSL-A. For example, in a schematic top-plan view, the auxiliary electrode 180 may include a first portion (hereinafter, referred to as a wide portion) 180A, which has a relatively greater width, and a second portion (hereinafter, referred to as a narrow portion) 180B that has a relatively smaller width, as shown in FIG. 7A. The wide portion 180A and the narrow portion 180B may be integrally connected to each other.

A width (a width in the x direction) W3 of the wide portion 180A is greater than a width (a width in the x direction) W4 of the narrow portion 180B. The width W3 of the wide portion 180A may be greater than a width of the common voltage line VSL and/or the auxiliary common voltage line VSL-A. According to an embodiment, FIG. 7A illustrates that the width W3 of the wide portion 180A is greater than the width W2 of the auxiliary common voltage line VSL-A and smaller than the width W1 of the common voltage line VSL. According to an embodiment, the width W3 of the wide portion 180A may be each of the width W2 of the auxiliary common voltage line VSL-A and the width W1 of the common voltage line VSL.

A portion of the auxiliary electrode 180 may contact any one of the common voltage line VSL and the auxiliary common voltage line VSL-A having a same voltage level. For example, the narrow portion 180B of the auxiliary electrode 180 may contact the auxiliary common voltage line VSL-A through the second contact hole CT2.

Another portion of the auxiliary electrode 180 may contact the second electrode 170 (see FIG. 6) of the first light-emitting diode OLED1. For example, the second electrode 170 (see FIG. 6) the first light-emitting diode OLED1 may contact the wide portion 180A of the auxiliary electrode 180 through a hole 160H that is formed in the intermediate layer 160 (see FIG. 6) disposed below the second electrode 170.

In a schematic top-plan view, the hole 160H of the intermediate layer 160 may overlap the wide portion 180A of the auxiliary electrode 180 and may be located in a second bank opening B-OP2 of the bank layer BNL (see FIG. 6). In a schematic top-plan view, the hole 160H of the intermediate layer 160 may entirely overlap the second bank opening B-OP2. The hole 160H of the intermediate layer 160 may also overlap an opening 109OP of the fifth insulating layer 109. In detail, in a schematic top-plan view, the hole 160H of the intermediate layer 160 may be located in the opening 109OP of the fifth insulating layer 109. Detailed structures of the auxiliary electrode 180 and components in a periphery thereof will be described in detail with reference to FIGS. 8 and 9A.

Figure 7B:
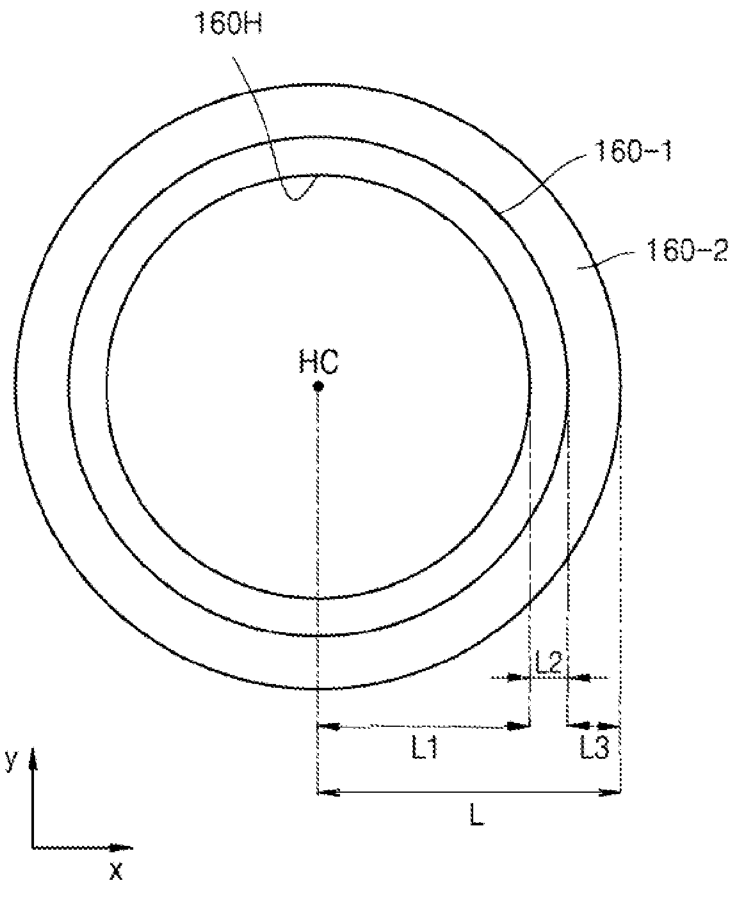
FIG. 7B is a schematic top-plan view of a periphery of a hole 160H shown in FIG. 7A.

FIG. 7B is a schematic top-plan view of an area around the hole 160H shown in FIG. 7A.

Referring to FIG. 7B, a first area 160-1, in which at least a portion of the intermediate layer 160 remains, may be located around the hole 160H. A second area 160-2 surrounding the first area 160-1, the second area 160-2 in which a protruding area of the intermediate layer 160 is located, may be located around the first area 160-1. The first area 160-1 and the second area 160-2 may be formed into a ring (or annular) type.

In a schematic top-plan view, the hole 160H may be located in the first area 160-1, and the first area 160-1 and the hole 160H may be located in the second area 160-2. A boundary of a plane shape of the hole 160H may have a circle shape. Plane shapes of the first area 160-1 and the second area 160-2 may be a ring (or annular) type. According to an embodiment, the plane shape of the hole 160H may be an ellipse. The plane shape of the first area 160-1 and the plane shape of the second area 160-2 may be a ring (or annular) type, and may each have an elliptical outline. The plane shape of the hole 160H is not limited to the shape mentioned above, and may include any plane shapes similar to a circle and having a range of distance from the center of the hole 160H to the boundary of the hole 160H.

An area of the plane shape of the hole 160H may be about 60±20% of an area inside an outermost boundary of the plane shape of the second area 160-2. The area inside the outermost boundary of the plane shape of the second area 160-2 may be a sum of an area of the plane shape of the hole 160H, an area of the plane shape of the first area 160-1, and an area of the plane shape of the second area 160-2.

In case that the area of the plane shape of the hole 160H is greater than about 80% of the area inside the outermost boundary of the plane shape of the second area 160-2, an inclination of the first area 160-1 increases, and therefore, the second electrode 170 may not be properly connected to the auxiliary electrode 180. In case that the area of the plane shape of the hole 160H is less than about 40% of the area inside the outermost boundary of the plane shape of the second area 160-2, a connection area between the second electrode 170 and the auxiliary electrode 180 may decrease, and therefore, an effect of reducing a voltage drop due to the auxiliary electrode 180 may decrease.

A circumference of the plane shape of the hole 160H, measured in a first direction, may be about 60±20% of a circumference of the outer boundary of the plane shape of the second area 160-2, similar to a relationship between the area of the plane shape of the hole 160H and the area inside the outermost boundary of the plane shape of the second area 160-2. For example, a first distance L1, which is measured in the first direction (for example, the x axis direction shown in FIG. 7B) and is a radius of the hole 160H with reference to a total distance L from the center of the hole 160H to the outermost boundary of the plane shape of the second area 160-2, may be about 60±20% of the total distance L.

A total area of the first area 160-1, which is a ring (or annular) type, may be about 15±10% of the area inside the outermost boundary of the plane shape of the second area 160-2. A second distance L2 from an inner boundary of the first area 160-1 to an outer boundary of the first area 160-1, measured in the first direction, may be about 15±10% of the total distance L. In case that the second distance L2 is less than about 5% of the total distance L, due to rapid increase in the thickness of the first area 160-1, the second electrode 170 located in the first area 160-1 may be broken in the first area 160-1. In case that the second distance L2 is greater than about 25% of the total distance L, due to decrease in a size of the hole 160H, the second electrode 170 and the auxiliary electrode 180 may not properly contact each other.

A total area of the second area 160-2, which is a ring (or annular) type, may be about 25±10% of the area inside the outermost boundary of the plane shape of the second area 160-2. A third distance L3 from an inner boundary of the second area 160-2 to an outer boundary of the second area 160-2, measured in the first direction, may be about 15±10% of the total distance L. Here, in case that the third distance L3 is greater than about 25% of the total distance L, the area of the hole 160H may excessively decrease, a contact area between the auxiliary electrode 180 and the second electrode 170 may also decrease, and therefore, the auxiliary electrode 180 and the second electrode 170 may not contact each other. On the other hand, in case that the third distance L3 is less than about 5% of the total distance L, a thickness of a protruding portion in the intermediate layer 160 may increase, and the second electrode 170 located in the protruding portion of the intermediate layer 160 may be disconnected from the auxiliary electrode 180.

Figure 8:
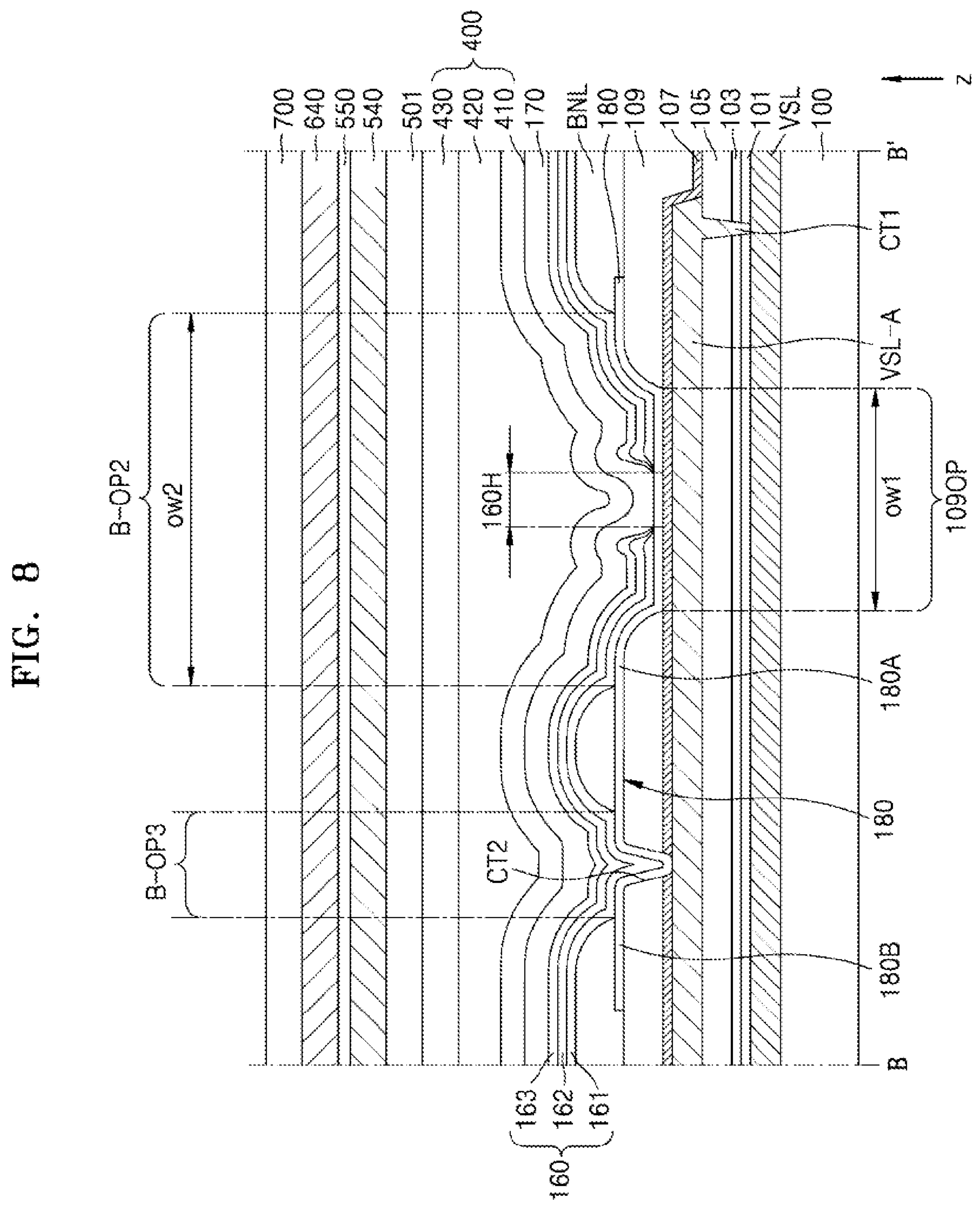
FIG. 8 is a schematic cross-sectional view taken along line B-B' shown in FIG. 7A.
Figure 9A:
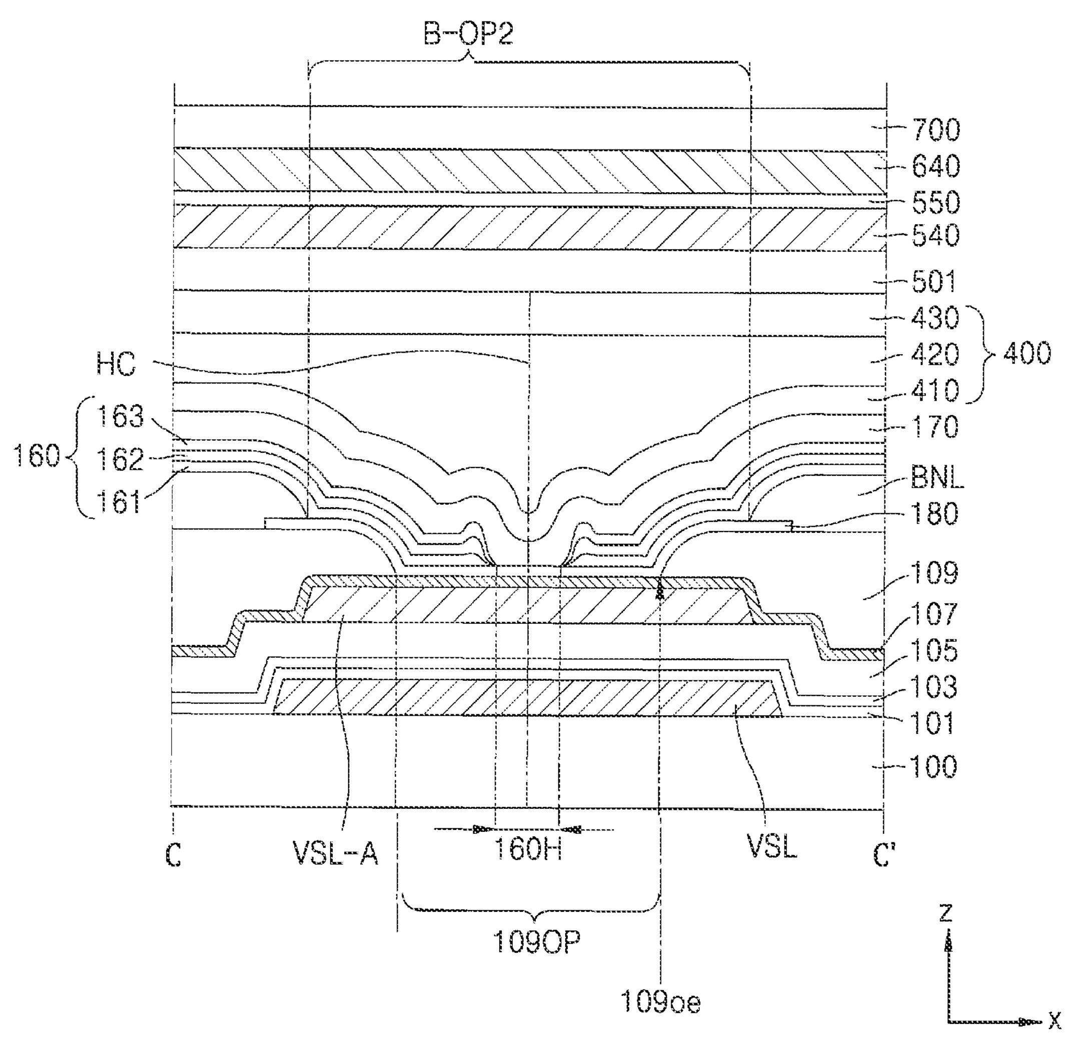
FIG. 9A is a schematic cross-sectional view taken along line C-C' shown in FIG. 7A.
Figure 9B:
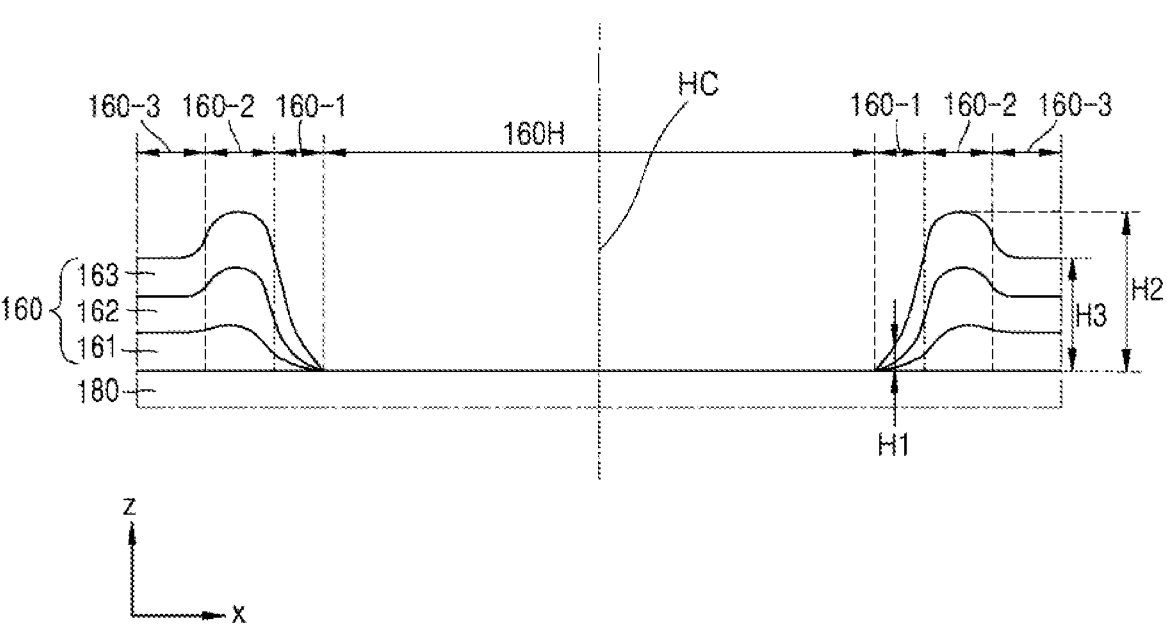
FIG. 9B is an enlarged schematic cross-sectional view of a portion of FIG. 9A.

FIG. 8 is a schematic cross-sectional view taken along line B-B' shown in FIG. 7A; FIG. 9A is a schematic cross-sectional view taken along line C-C' shown in FIG. 7A; and FIG. 9B is an enlarged schematic cross-sectional view of a portion of FIG. 9A.

Referring to FIGS. 7A, 8, 9A, and 9B, the common voltage line VSL is disposed on the substrate 100. The common voltage line VSL may contact or directly contact a top surface of the substrate 100. The common voltage line VSL may include a metal material such as Mo, Cu, Ti, and the like within the spirit and the scope of the disclosure. The common voltage line VSL may include same materials or similar materials as the driving voltage line VDL described above with reference to FIG. 6. The common voltage line VSL may include a stack structure including a Ti layer (a lower layer) and a Cu layer (an upper layer) having a thickness greater than a thickness of the titanium layer. According to an embodiment, the common voltage line VSL may include a multi-layer structure, which may include one or more metal layers including the above-stated metal materials and a transparent conductive oxide layer such as ITO disposed on the one or more metal layers.

The auxiliary common voltage line VSL-A is disposed on the common voltage line VSL, and at least one insulating layer may be disposed between the common voltage line VSL and the auxiliary common voltage line VSL-A. In this regard, FIGS. 8 and 9A illustrate that the first insulating layer 101, the second insulating layer 103, and the third insulating layer 105 are disposed between the common voltage line VSL and the auxiliary common voltage line VSL-A.

As shown in FIG. 8, the auxiliary common voltage line VSL-A may contact the first common voltage line VSL through the first contact hole CT1 penetrating through the first insulating layer 101, the second insulating layer 103, and the third insulating layer 105. The auxiliary common voltage line VSL-A may include a metal material such as Mo, Cu, Ti, and the like within the spirit and the scope of the disclosure. The auxiliary common voltage line VSL-A may include a same material or a similar material as the common voltage line VSL. For example, the auxiliary common voltage line VSL-A may include a stack structure including a Ti layer (a lower layer) and a Cu layer (an upper layer) having a thickness greater than a thickness of the titanium layer. According to an embodiment, the auxiliary common voltage line VSL-A may include a material different from the material of the common voltage line VSL. For example, the auxiliary common voltage line VSL-A may include a multi-layer structure including one or more metal layers including the metal materials described above and a transparent conductive oxide material layer such as ITO disposed on the one or more metal layers, while the common voltage line VSL does not include the transparent conductive oxide material layer and may only include layers including metal.

The auxiliary common voltage line VSL-A may be protected by the fourth insulating layer 107. For example, the fourth insulating layer 107 may cover or overlap the auxiliary common voltage line VSL-A while contacting or directly contacting the top surface of the auxiliary common voltage line VSL-A. By way of example, the fourth insulating layer 107 may cover or overlap a portion of the auxiliary common voltage line VSL-A right under or below the opening 109OP of the fifth insulating layer 109. As described above, the fourth insulating layer 107 may include an inorganic insulating material.

The fifth insulating layer 109 may be disposed on the fourth insulating layer 107. The opening 109OP of the fifth insulating layer 109 may provide an outgassing path. For example, in a process of manufacturing the display device, gas included in the fifth insulating layer 109 may be discharged through the opening 109OP of the fifth insulating layer 109.

The opening 109OP of the fifth insulating layer 109 may overlap the auxiliary common voltage line VSL-A. In a process of forming the opening 109OP and/or a next process thereof, a portion of the auxiliary common voltage line VSL-A right under or below the opening 109OP may be covered with or overlapped by the fourth insulating layer 107 to prevent the auxiliary common voltage line VSL-A from being damaged. According to an embodiment, the auxiliary common voltage line VSL-A may include Cu having a relatively low resistance. For example, the auxiliary common voltage line VSL-A may include a stack structure including a Ti layer (a lower layer) and a Cu layer (an upper layer), and the Cu layer, which is relatively fragile, is covered or overlapped by the fourth insulating layer 107 and thus may be prevented from damage.

The auxiliary electrode 180 may be disposed on the fifth insulating layer 109. The auxiliary electrode 180 may contact the auxiliary common voltage line VSL-A through the second contact hole CT2 penetrating through the fifth insulating layer 109 and the fourth insulating layer 107. As the auxiliary common voltage line VSL-A contacts the common voltage line VSL through the first contact hole CT1, the auxiliary electrode 180 may be electrically connected to the common voltage line VSL, having the auxiliary common voltage line VSL-A as a medium.

The auxiliary electrode 180 may include a same material or a similar material as the first electrode 150 (see FIG. 6) of the first light-emitting diode OLED1. For example, the auxiliary electrode 180 may include a stack structure of an ITO layer/an Ag layer/an ITO layer. A portion of the auxiliary electrode 180, for example, the wide portion 180A, may overlap the opening 109OP of the fifth insulating layer 109. The wide portion 180A of the auxiliary electrode 180 may contact or directly contact a top surface of the fourth insulating layer 107. For example, in an area corresponding to the opening 109OP of the fifth insulating layer 109, the top surface of the fourth insulating layer 107 may contact or directly contact the auxiliary electrode 180, and a bottom surface of the fourth insulating layer 107 may contact or directly contact the auxiliary common voltage line VSL-A.

The bank layer BNL may be disposed on the auxiliary electrode 180. The bank layer BNL may include a second bank opening B-OP2 and a third bank opening B-OP3, overlapping the wide portion 180A of the auxiliary electrode 180 and the narrow portion 180B of the auxiliary electrode 180, respectively.

The second bank opening B-OP2 overlaps the entire portion of the opening 109OP of the fifth insulating layer 109, and a size (or a width) ow2 of the second bank opening B-OP2 is greater than a size (or a width) ow1 of the opening 109OP of the fifth insulating layer 109. Therefore, in a schematic top-plan view of FIG. 7A, the opening 109OP of the fifth insulating layer 109 is located in the second bank opening B-OP2. In this regard, in a schematic top-plan view, FIG. 7A illustrates that a contour line 109B of the opening 109OP of the fifth insulating layer 109 is in a contour line BNLB of the second bank opening B-OP2.

The intermediate layer 160, which may include the first function layer 161, the emission layer 162, and the second function layer 163, is disposed on the bank layer BNL. A portion of the intermediate layer 160 may include the hole 160H located in the second bank opening B-OP2 and overlapping the opening 109OP of the fifth insulating layer 109. The hole 160H of the intermediate layer 160 may penetrate through the first function layer 161, the emission layer 162, and the second function layer 163. The second electrode 170 of the light-emitting diode may contact the auxiliary electrode 180 through the hole 160H of the intermediate layer 160.

As shown in FIGS. 8, 9A, and 9B, the hole 160H of the intermediate layer 160 may overlap the opening 109OP of the fifth insulating layer 109.

As shown in FIGS. 8, 9A, and 9B, the first area 160-1 and the second area 160-2 may be arranged around the hole 160H that is located as described above. The first area 160-1 may be arranged to cover or overlap a boundary of the hole 160H, and the second area 160-2 may be arranged to cover or overlap an outer boundary of the first area 160-1.

A first thickness H1 of the first area 160-1 and a second thickness H2 of the second area 160-2 may change in the first direction (for example, the x direction shown in FIG. 9A). For example, the first thickness H1 may decrease in a first direction. For example, the first thickness H1 may increase away from the center of the hole 160H. The second thickness H2 may first increase and then decrease, in the first direction. A maximum point, at which the intermediate layer 160 has a greatest thickness, may be in the second area 160-2. For example, the second thickness H2 may increase away from the first area 160-1 and decrease after the maximum point.

According to an embodiment, the first area 160-1 may be an area in which only a portion of the intermediate layer 160 remains. For example, the first area 160-1 may be an area formed by removing at least a portion of the intermediate layer 160. By way of example, the first area 160-1 may be an area formed by removing at least a portion of the second function layer 163, which is at an uppermost portion of the intermediate layer 160. For example, the first area 160-1 may be an area after the second function layer 163, which is at the uppermost portion of the intermediate layer 160, is totally removed and a portion of the emission layer 162 is also removed. For example, the first area 160-1 may also indicate an area after the second function layer 163, which is at the uppermost portion of the intermediate layer 160, is totally removed, a portion of the emission layer 162 is removed, and at least a portion of the first function layer 161 is also removed.

According to an embodiment, the first area 160-1 may indicate an area in which the thickness of the intermediate layer 160 is equal to or less than a thickness of the third area 160-3 located outside the second area 160-2. According to an embodiment, the first area 160-1 may indicate an area in which a thickness of at least one layer or at least a layer in the intermediate layer 160 is less than a thickness of at least one layer or at least a layer in the intermediate layer 160 that is located in the third area 160-3 outside the second area 160-2. One layer or a layer in the intermediate layer 160, compared in the first region 160-1 and the third region 160-3, may indicate a layer including a same material or a similar material.

Unlike the first area 160-1, the second area 160-2 may be an area in which the intermediate layer 160 is not removed. According to an embodiment, the second area 160-2 may indicate an area in which the thickness of the intermediate layer 160 is greater than the thickness of the intermediate layer 160 located in the third area 160-3. According to an embodiment, the first area 160-1 may indicate an area in which a thickness of each layer included in the intermediate layer 160 is greater than a thickness of each layer included in the intermediate layer 160 that is located in the third area 160-3 located outside the second area 160-2. One layer or a layer in the intermediate layer 160, compared in the first region 160-1 and the third region 160-3, may indicate a layer including a same material or a similar material.

In addition to the definition stated above, the first area 160-1 and the second area 160-2 may also be defined according to a total thickness of the intermediate layer 160.

For example, the first thickness H1 of the first area 160-1 may be less than the third thickness H3 of the third area 160-3. The first thickness H1 may be about 10±5% of the third thickness H3. By way of example, the first thickness H1 may be in a range equal to or greater than about 200 Å and equal to or less than about 600 Å. As the first thickness H1 gradually increases away from the hole 160H, rapid bending of the second electrode 170 at a boundary between the hole 160H and the first area 160-1 may be prevented.

The second thickness H2 may be greater than the first thickness H1. A maximum value of the second thickness H2 may be about 140±20% of the third thickness H3.

Bending of the second electrode 170 and non-contact between the second electrode 170 and the auxiliary electrode 180 in the entire portion of the hole 160H may be resolved by controlling a bending angle of the second electrode 170 located on the intermediate layer 160, a tilt angle of the second electrode 170 after forming, and the like through the structure described above.

The first thickness H1, the second thickness H2, and the third thickness H3 described above may indicate distances from the top surface of the auxiliary electrode 180 to the top surface of the intermediate layer 160 arranged at uppermost layers of the areas. For example, the first thickness H1, the second thickness H2, and the third thickness H3 may be measured in the z direction shown in FIGS. 9A and 9B.

A center HC of the hole 160H of the intermediate layer 160 may be located in the opening 109OP of the fifth insulating layer 109, as shown in FIG. 9A. In other words, the center HC of the hole 160H of the intermediate layer 160 may define the opening 109OP and may be located inside an inner edge 109*oe* of the fifth insulating layer 109 corresponding to the contour line 109B (see FIG. 7A) of the fifth insulating layer 109. For example, the center HC of the hole 160H of the intermediate layer 160 may be located almost the same as the center of the opening 109OP.

The hole 160H of the intermediate layer 160 may be formed by irradiating a laser beam.

The encapsulation layer 400, which may include the first inorganic encapsulation layer 410, the organic encapsulation layer 420, and the second inorganic encapsulation layer 430, may cover or overlap a contact area (or a connection area) between the auxiliary electrode 180 and the second electrode 170 of the light-emitting diode. The contact area between the auxiliary electrode 180 and the second electrode 170 of the light-emitting diode may overlap the intermediate material layer 501, the first light-shielding unit 540 of the color conversion-transmission layer 500, the barrier layer 550, the second light-shielding unit 640 of the color layer 600, and the light-transmitting base layer 700.

FIGS. 10 to 14 are schematic cross-sectional views according to a process of manufacturing the display device, according to an embodiment. For convenience of description, FIGS. 10 to 14 illustrate schematic cross-sectional views according to a process of manufacturing the display device, for example, a schematic cross-sectional view taken along line A-A' shown in FIG. 5 and a schematic cross-sectional view taken along line C-C' shown in FIG. 7A.

Figure 10:
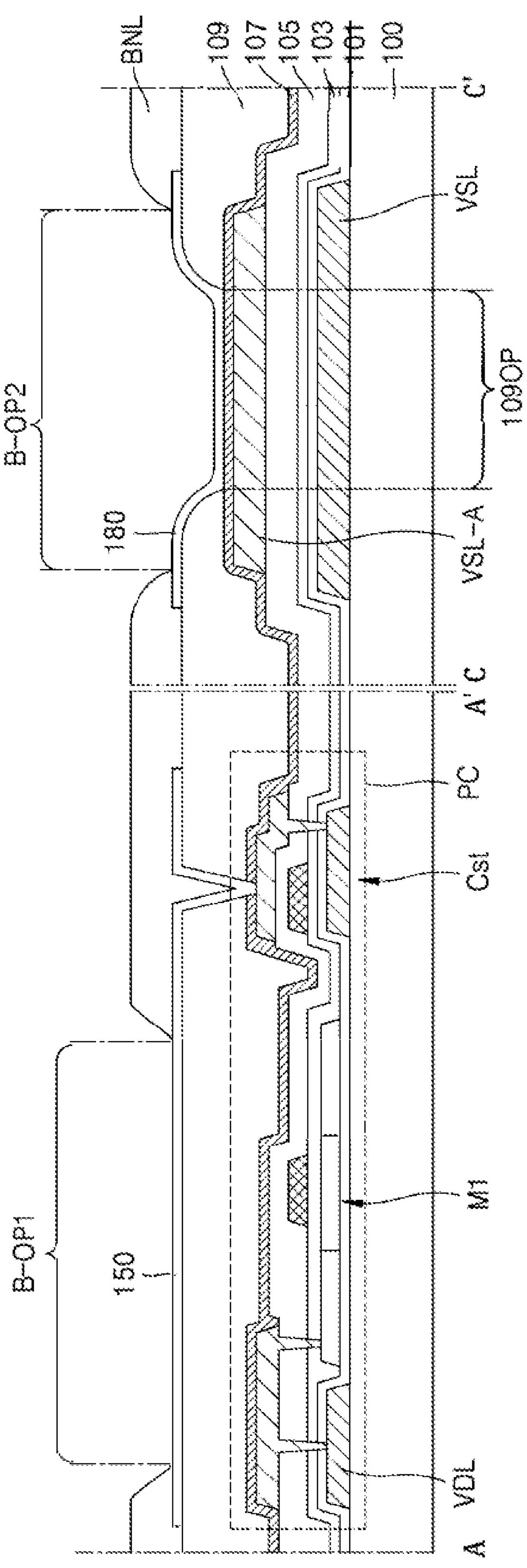

Referring to FIG. 10, the first electrode 150 and the auxiliary electrode 180 of the light-emitting diode are formed on an insulating layer, for example, the fifth insulating layer 109. The first electrode 150 and the auxiliary electrode 180 may be manufactured together in a same process and may include a same material or a similar material.

Before the first electrode 150 and the auxiliary electrode 180 are formed above the substrate 100, the pixel circuit PC including the driving transistor M1 and the storage capacitor Cst may be formed on the substrate 100. The first insulating layer 101, the second insulating layer 103, the third insulating layer 105, the fourth insulating layer 107, and the fifth insulating layer 109 may be formed on the substrate 100, and example materials and locations thereof are the same as described with reference to FIGS. 6, 8, and 9A.

The driving voltage line VDL, the common voltage line VSL, and the auxiliary common voltage line VSL-A may be formed together with the electrodes of the driving transistor M1 and/or the storage capacitor Cst. Although not shown in FIG. 10, before a process of forming the auxiliary common voltage line VSL-A, the first contact hole CT1 (see FIG. 8) penetrating through the first insulating layer 101, the second insulating layer 103, and the third insulating layer 105 may be formed, and the common voltage line VSL may contact the auxiliary common voltage line VSL-A through the first contact hole CT1 (see FIG. 8). After the auxiliary common voltage line VSL-A is formed, the fourth insulating layer 107 including an inorganic insulating layer may be formed.

The fifth insulating layer 109 is formed on the fourth insulating layer 107. A process of forming the fifth insulating layer 109 may include a process of forming the sixth contact hole CT6, for contact between the pixel circuit PC and the first electrode 150, and a process of forming the opening 109OP of the fifth insulating layer 109. The opening 109OP may be formed by etching a portion overlapping the auxiliary common voltage line VSL-A in the fifth insulating layer 109, and accordingly, the opening 109OP may overlap the auxiliary common voltage line VLS-A. The second contact hole CT2 (see FIG. 8) described above with reference to FIG. 8 may be formed together with the opening 109OP of the fifth insulating layer 109.

The bank layer BNL, which is formed on the first electrode 150 and the auxiliary electrode 180, may include the first bank opening B-OP1 overlapping the first electrode 150 and the second bank opening B-OP2 overlapping the auxiliary electrode 180. A size (or a width) of the second bank opening B-OP2 may be less than a size (or a width) of the first bank opening B-OP1.

Figure 11:
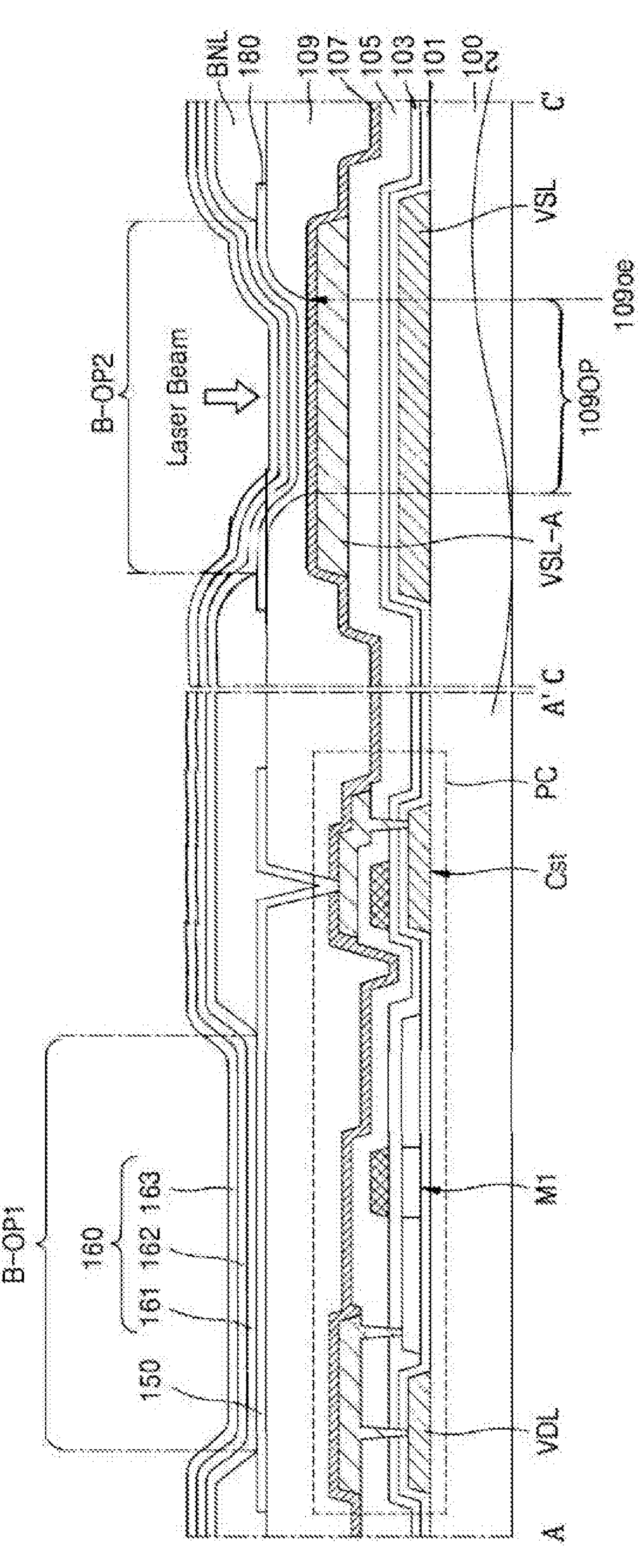

Referring to FIG. 11, the intermediate layer 160 is formed on the bank layer BNL. The intermediate layer 160 may overlap the first electrode 150 exposed through the first bank opening B-OP1 and the auxiliary electrode 180 exposed through the second bank opening B-OP 2.

The intermediate layer 160 may include the emission layer 162, and accordingly, a process of forming the intermediate layer 160 may include a process of forming the emission layer 162. The process of forming the intermediate layer 160 may further include a process of forming the first function layer 161 disposed under or below the emission layer 162 and/or the second function layer 163 disposed on the emission layer 162. The intermediate layer 160 will be described as including the first function layer 161, the emission layer 162, and the second function layer 163 with reference to FIG. 11 and FIGS. 12 to 14 to be described later.

A laser beam is irradiated onto the intermediate layer 160 to form the hole 160H as shown in FIG. 11. According to an embodiment, UV laser having a wavelength in a range of about 300 nm to about 400 nm may be used as the laser beam, and an output per unit area may be equal to or less than about 200 mJ/cm$^2$. The laser beam may include a Gaussian beam. The laser beam may have a greatest energy density at a center thereof, and the energy density of the laser beam may decrease away from the center of the laser beam.

In case that the laser beam is irradiated, the laser beam may be in the second bank opening B-OP2, and the center of the laser beam may be located in the opening 109OP of the fifth insulating layer 109. In other words, the center of the laser beam may be located inside the inner edge 109*oe* of the fifth insulating layer 109, which corresponds to the contour line of the opening 109OP of the fifth insulating layer 109. For example, the center of the laser beam may be located at the center of the opening 109OP. In case that the center of the laser beam crosses out of the inner edge 109*oe* and overlaps the material of the fifth insulating layer 109, the fifth insulating layer 109 and/or the auxiliary electrode 180 may be excited due to outgassing, and therefore, it may be appropriate that the center of the laser beam is located in the opening 109OP of the fifth insulating layer 109.

A hole of the first function layer 161, a hole of emission layer 162, and a hole of the second function layer 163 may be formed by the laser beam. A center of the hole of the emission layer 162 may be identical to a center of the hole of the emission layer, for example, a center of the hole of the first function layer 161. A size of the hole of the first function layer 161, a size of the hole of the emission layer 162, and a size of the hole of the second function layer may be identical to or different from one another.

The hole 160H of the intermediate layer 160 may be formed as the hole of the first function layer 161, the hole of the emission layer 162, and the hole of the second function layer 163 overlap one another. The center of the hole 161H of the first function layer 161, the center of the hole 162H of the emission layer 162, and the center of the hole 163H of the second function layer 163 may correspond to the center HC of the hole 160H described above with reference to FIG. 9A.

The first area 160-1 and the second area 160-2, described above with reference to FIG. 9B, may be formed around the hole 160H by irradiating the laser beam to the intermediate layer 160. Here, as shapes of the first area 160-1 and the second area 160-2 are identical or similar to the shapes described with reference to FIG. 9B, detailed descriptions thereof are omitted.

For example, as the laser beam has a Gaussian shape, the hole 160H may be formed in an area adjacent to the center of the laser beam by totally removing the intermediate layer 160, and an area in which at least a portion of the intermediate layer 160, like the first area 160-1, may be formed in a portion apart from the center of the laser beam. By doing so, the second electrode 170 located in the hole 160H may have a gentle slope without being acutely bent at the boundary between the first area 160-1 and the hole 160H.

Figure 13:
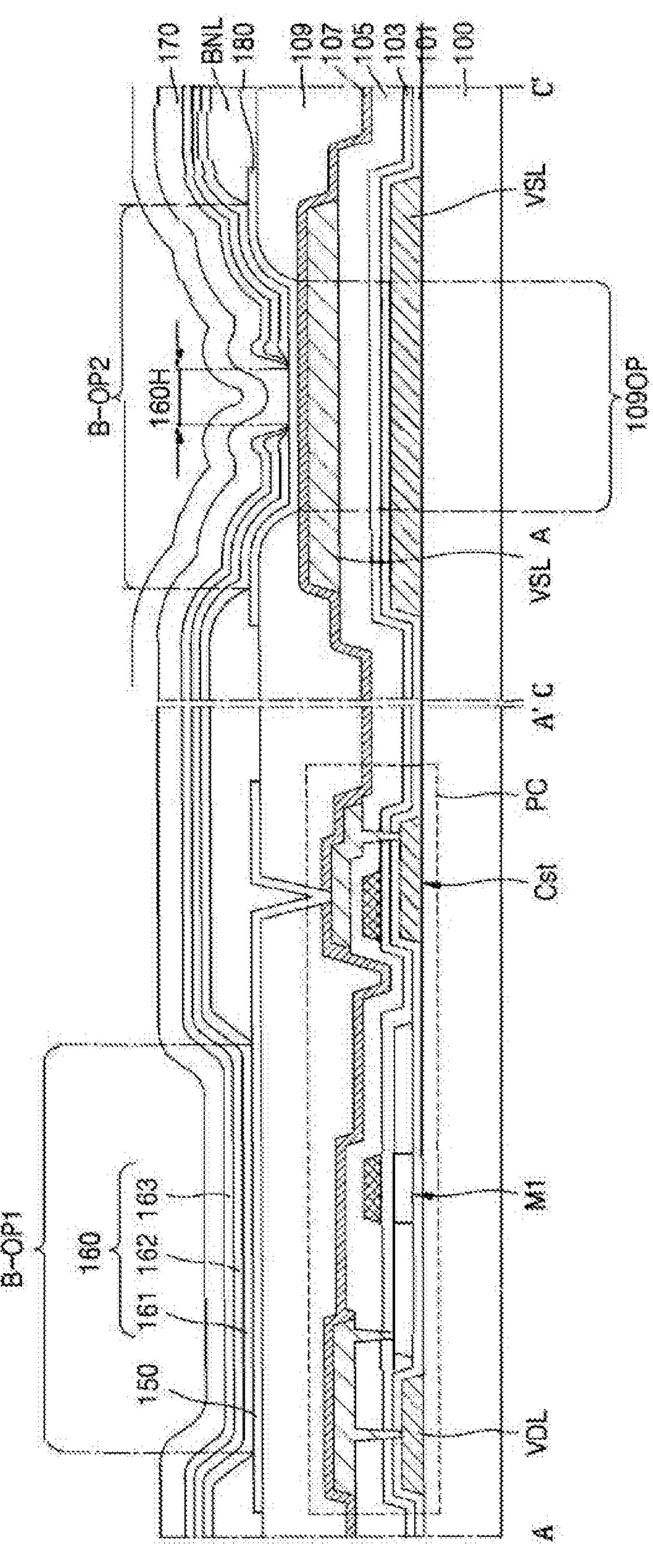

The second electrode 170 of the light-emitting diode is formed as shown in FIG. 13. The second electrode 170 may contact or directly contact the auxiliary electrode 180 and be electrically connected thereto through the hole 160H. An area in which the second electrode 170 and the auxiliary electrode 180 may contact may be located in the second bank opening B-OP 2, and a portion of the contact area may be located on the slope surface of the fifth insulating layer 109.

Figure 14:
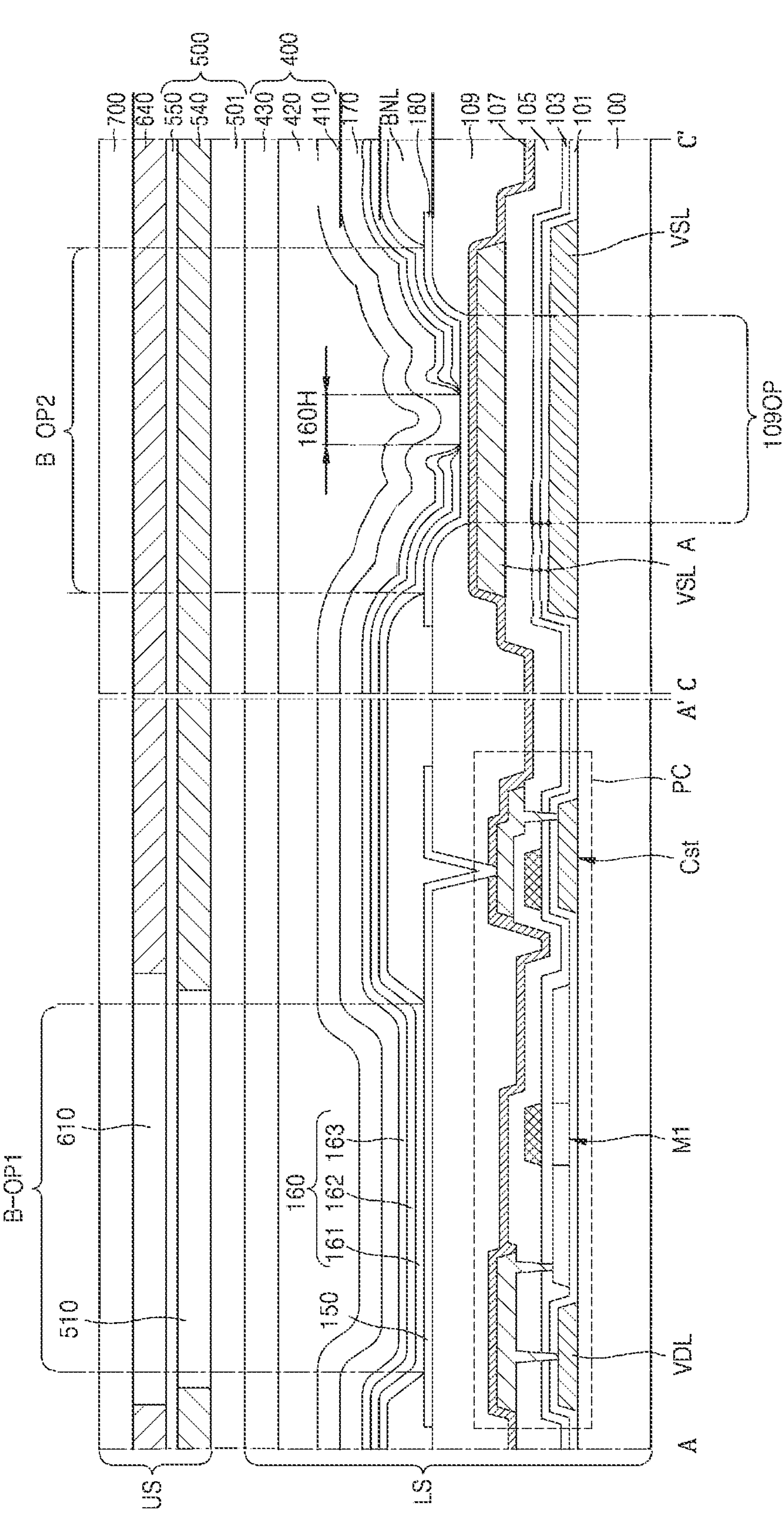

Referring to FIG. 14, the encapsulation layer 400 is formed on the second electrode 170. The encapsulation layer 400 may include the first inorganic encapsulation layer 410 and the second inorganic encapsulation layer 430, which are formed by chemical vapor deposition, and the organic encapsulation layer 420 which may be formed by, for example, a method of applying and curing monomer. The color conversion-transmission layer 500, the color layer 600, and the light-transmitting base layer 700 may be formed on the encapsulation layer 400.

According to an embodiment, a lower structure LS from the substrate 100 to the encapsulation layer 400 may be formed, an upper structure US including the color conversion-transmission layer 500, the color layer 600, and the light-transmitting base layer 700 may be formed, and the lower structure LS and the upper structure US may be arranged and bonded to each other such that the encapsulation layer 400 and the color conversion-transmission layer 500 face each other with the intermediate material layer 501 between the encapsulation layer 400 and the color conversion-transmission layer 500.

According to an embodiment, the lower structure LS and the upper structure US may be not formed.

Instead, the intermediate material layer 501 may be formed on the encapsulation layer 400, and the color conversion-transmission layer 500, the color layer 600, and the light-transmitting base layer 700 may be sequentially formed on the intermediate material layer 501.

Figure 15:
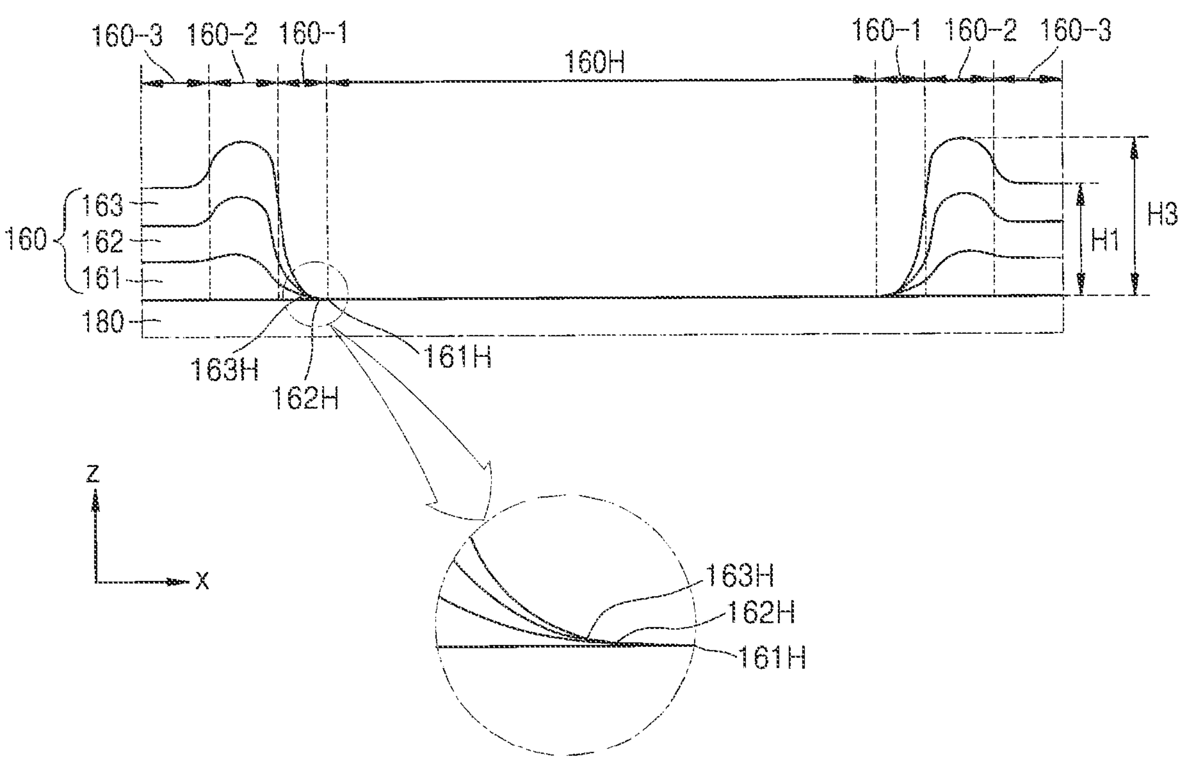
FIG. 15 is a schematic cross-sectional view of a hole in the display device and an area around the hole, according to an embodiment.

FIG. 15 is a schematic cross-sectional view of the hole of the display device and an area around the hole, according to an embodiment.

Referring to FIG. 15, the first area 160-1 and the second area 160-2, which are arranged around the hole 160H, may be identical or similar to the first area 160-1 and the second area 160-2 described above. The hole 161H of the first function layer 161, the hole 162H of the emission layer 162, and the hole 163H of the second function layer 163 may be arranged in the first area 160-1, due to the laser beam. The center of the hole 162H of the emission layer 162 may be identical to the centers of the holes of the function layers, for example, the center of the hole 161H of the first function layer 161 and the center of the hole 162H of the emission layer 162.

As the hole 161H of the first function layer 161, the hole 162H of the emission layer 162, and the hole 163H of the second function layer 163 overlap one another, the hole 160H of the intermediate layer 160 may be formed, and the center of the hole 161H of the first function layer 161, the center of the hole 162H of the emission layer 162, and the center of the hole 163H of the second function layer 163 may correspond to the center HC of the hole 160H described above with reference to FIG. 9A.

The hole 163H of the second function layer 163 may be located in the hole 162H of the emission layer 162, and the hole 162H of the emission layer 162 may be located in the hole 161H of the first function layer 161. The hole 160H of the intermediate layer 160 may be defined by the hole 161H of the first function layer 161. In a portion in which the first function layer 161 and the emission layer 162 overlap each other and a portion in which the first function layer 161, the emission layer 162, and the second function layer 163 overlap one another, a thickness of each of the first function layer 161, the emission layer 162, and the second function layer 163 may decrease. According to an embodiment, although not shown, the thickness of the first function layer 161 may be maintained the same in the portion in which the first function layer 161 and the emission layer 162 overlap each other, and the thickness of each of the first function layer 161 and the emission layer 162 may be maintained the same in the portion in which the first function layer 161, the emission layer 162, and the second function layer 163 overlap one another.

Figure 16:
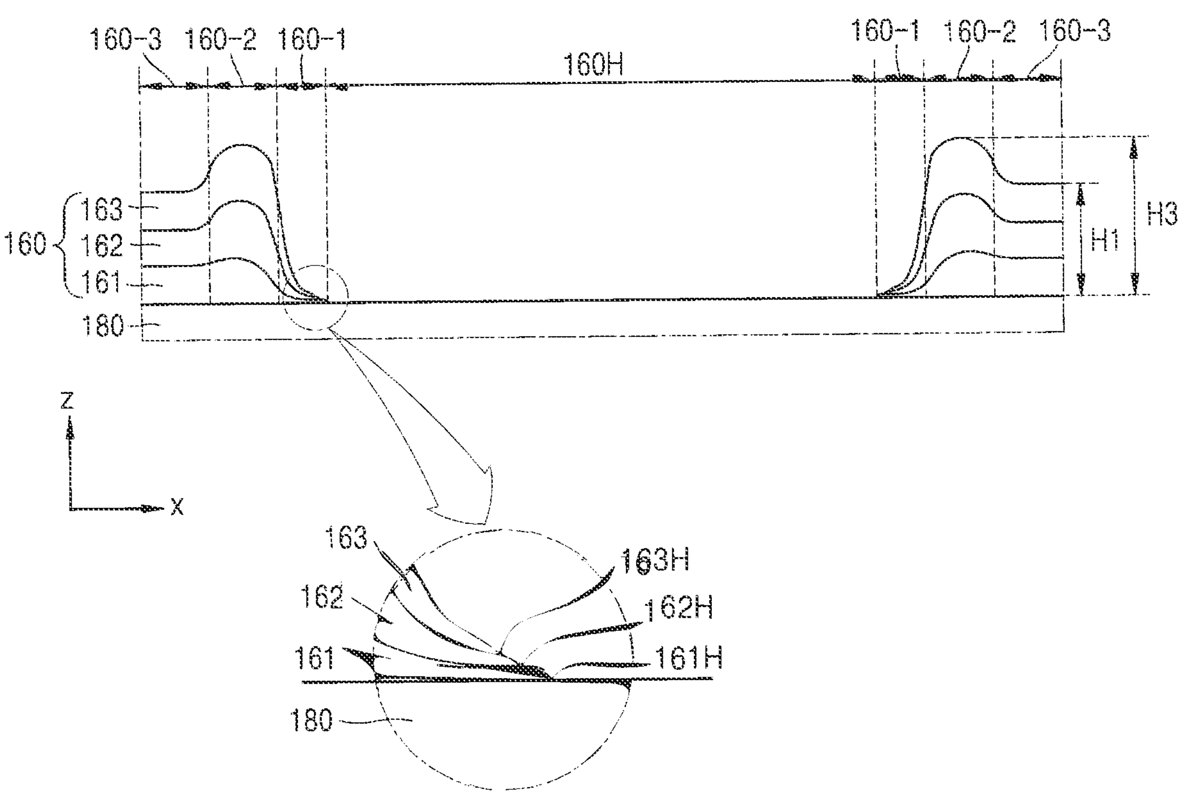
FIG. 16 is a schematic cross-sectional view of the hole in the display device and the area around the hole, according to an embodiment.

FIG. 16 is a schematic cross-sectional view of the hole of the display device and the area around the hole, according to an embodiment.

Referring to FIG. 16, the first area 160-1 and the second area 160-2, which are arranged around the hole 160H, may be identical or similar to the first area 160-1 and the second area 160-2 described above. The hole 161H of the first function layer 161, the hole 162H of the emission layer 162, and the hole 163H of the second function layer 163 may be arranged in the first area 160-1, due to the laser beam. The center of the hole 162H of the emission layer 162 may be identical to the centers of the holes of the function layers, for example, the center of the hole 161H of the first function layer 161 and the center of the hole 162H of the emission layer 162. Here, the hole 161H of the first function layer 161, the hole 162H of the emission layer 162, and the hole 163H of the second function layer 163 may be similar to the hole 161H of the first function layer 161, the hole 162H of the emission layer 162, and the hole 163H of the second function layer 163 described above with reference to FIG. 15.

An inner surface of each of the hole 161H of the first function layer 161, the hole 162H of the emission layer 162, and the hole 163H of the second function layer 163H may be inclined. The first function layer 161, the emission layer 162, and the second function layer 163 may be arranged with step differences with reference to the hole 160H of the intermediate layer 160.

According to one or more embodiments, contact quality of an area in which the auxiliary electrode and the second electrode thereon contact may be secured by having the intermediate layer including the hole. According to one or more embodiments, vivid images may be provided. However, these advantageous effects are examples, and the scope of the embodiments is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope defined by the claims.

What is claimed is:

1. A display device comprising:

an organic insulating layer disposed on a substrate and having an opening and a contact opening;

a first electrode disposed on the organic insulating layer;

an auxiliary electrode disposed on the organic insulating layer, the auxiliary electrode having a first portion overlapping the opening of the organic insulating layer in a plan view and a second portion overlapping the contact opening of the organic insulating layer in the plan view;

a bank layer including a first bank opening and a second bank opening, the first bank opening overlapping the first electrode in the plan view, and the second bank opening overlapping the first portion of the auxiliary electrode in the plan view;

an intermediate layer disposed on the first electrode and the auxiliary electrode, the intermediate layer including a hole exposing a portion of the auxiliary electrode in the opening of the organic insulating layer; and a second electrode disposed on the intermediate layer and overlapping the first electrode and the auxiliary electrode in the plan view, the second electrode electrically contacting the auxiliary electrode through the hole of the intermediate layer, wherein a thickness of the intermediate layer varies in a direction away from a center of the hole of the intermediate layer, wherein the first portion of the auxiliary electrode is laterally spaced apart from the second portion of the auxiliary electrode, and wherein the first portion of the auxiliary electrode is wider than the second portion of the auxiliary electrode in the plan view.

2. The display device of claim 1, wherein the intermediate layer further comprises:

a first area adjacent to the hole of the intermediate layer; and a second area adjacent to the first area, the second area extended to the first area and having a maximum point that is a greatest height of the intermediate layer.

3. The display device of claim 2, wherein a thickness of the first area increases in a direction away from the hole of the intermediate layer.

4. The display device of claim 2, wherein a plane shape of at least one of the first area and the second area is annular.

5. The display device of claim 2, wherein an area of a plane shape of the hole of the intermediate layer is about 60±20% of a sum of the area of the plane shape of the hole of the intermediate layer, an area of a plane shape of the first area, and an area of a plane shape of the second area.

6. The display device of claim 2, wherein a radius of a plane shape of the hole of the intermediate layer, is about 60±20% of a radius of an outer boundary of a plane shape of the second area.

7. The display device of claim 2, wherein a distance from a boundary of the hole of the intermediate layer to an outer boundary of a plane shape of the first area, is about 15±10% of a radius of an outer boundary of a plane shape of the second area.

8. The display device of claim 2, wherein a distance from an outer boundary of a plane shape of the first area to an outer boundary of a plane shape of the second area, is about 25±20% of a radius of the outer boundary of the plane shape of the second area.

9. The display device of claim 2, wherein the thickness of the intermediate layer in the first area is about 10±5% of the thickness of the intermediate layer at an outer edge of the second area.

10. The display device of claim 2, wherein the thickness of the intermediate layer in the first area is greater than or equal to about 200Å and less than or equal to about 600 Å.

11. The display device of claim 2, wherein a maximum value of the thickness of the intermediate layer in the second area is about 140±20% of the thickness of the intermediate layer at an outer edge of the second area.

12. The display device of claim 1, wherein the intermediate layer comprises an emission layer, and the hole of the intermediate layer penetrates through the emission layer.

13. The display device of claim 1, further comprising:

a common voltage line disposed on the substrate and extending in a direction; and an auxiliary common voltage line overlapping the common voltage line in the plan view, the auxiliary common voltage line electrically connected to the common voltage line through a contact hole in at least one insulation layer disposed between the common voltage line and the auxiliary common voltage line, wherein the auxiliary common voltage line and the common voltage line overlap the opening of the organic insulating layer in the plan view.

14. The display device of claim 13, further comprising:

an inorganic insulating layer directly contacting an upper surface of the auxiliary common voltage line.

15. The display device of claim 14, wherein the auxiliary electrode comprises:

the first portion overlapping an opening of the organic insulating layer in a plan view and having a width greater than a width of the opening of the organic insulating layer; and the second portion integral with the first portion, wherein the second portion of the auxiliary electrode is electrically connected to the auxiliary common voltage line through a contact hole penetrating through the organic insulating layer and the inorganic insulating layer.

16. A display device comprising:

an organic insulating layer disposed on a substrate and having an opening;

a first electrode disposed on the organic insulating layer;

an auxiliary electrode disposed on the organic insulating layer, the auxiliary electrode having a first portion overlapping the opening of the organic insulating layer in a plan view;

a bank layer including a first bank opening and a second bank opening, the first bank opening overlapping the first electrode in the plan view, and the second bank opening overlapping the first portion of the auxiliary electrode in the plan view;

an intermediate layer disposed on the first electrode and the auxiliary electrode, the intermediate layer including a hole exposing a portion of the auxiliary electrode in the opening of the organic insulating layer; and a second electrode disposed on the intermediate layer and overlapping the first electrode and the auxiliary electrode in the plan view, the second electrode electrically contacting the auxiliary electrode through the hole of the intermediate layer, wherein the intermediate layer further comprises:

a first area adjacent to the hole of the intermediate layer, a first thickness of the first area varying in the first area;

a second area adjacent to and extending from the first area and within the opening of the organic insulating layer, a second thickness of the second area varying in the second area, the second thickness having a maximum point at which the intermediate layer has a greatest thickness; and a third area disposed at an outer edge of the second area and within the opening of the organic insulating layer, the third area having a third thickness that is uniform.

17. The display device of claim 16, wherein the first thickness increases in a direction away from the hole of the intermediate layer.

18. The display device of claim 16, wherein a plane shape of at least one of the first area and the second area is annular.

19. The display device of claim 16, wherein an area of a plane shape of the hole of the intermediate layer is about 60±20% of a sum of the area of the plane shape of the hole of the intermediate layer, an area of a plane shape of the first area, and an area of a plane shape of the second area.

20. The display device of claim 16, wherein a radius of a plane shape of the hole of the intermediate layer is about 60±20% of a radius of an outer boundary of a plane shape of the second area.

21. The display device of claim 16, wherein a distance from a boundary of the hole of the intermediate layer to an outer boundary of a plane shape of the first area, is about 15±10% of a radius of an outer boundary of a plane shape of the second area.

22. The display device of claim 16, wherein a distance from an outer boundary of a plane shape of the first area to an outer boundary of a plane shape of the second area, is about 25±20% of a radius of the outer boundary of the plane shape of the second area.

23. The display device of claim 16, wherein the first thickness is about 10±5% of the third thickness.

24. The display device of claim 16, wherein the first thickness is greater than or equal to about 200 Å and less than or equal to about 600 Å.

25. The display device of claim 16, wherein a maximum value of the second thickness is about 140+20% of the third thickness.

26. The display device of claim 16, wherein the intermediate layer comprises an emission layer, and the hole of the intermediate layer penetrates through the emission layer.

27. The display device of claim 16, further comprising:

a common voltage line disposed on the substrate and extending in a direction; and an auxiliary common voltage line overlapping the common voltage line in the plan view, the auxiliary common voltage line electrically connected to the common voltage line through a contact hole in at least one insulation layer disposed between the common voltage line and the auxiliary common voltage line, wherein the auxiliary common voltage line and the common voltage line overlap the opening of the organic insulating layer in the plan view.

28. The display device of claim 27, further comprising:

an inorganic insulating layer directly contacting an upper surface of the auxiliary common voltage line.

29. The display device of claim 28, wherein the auxiliary electrode comprises:

the first portion overlapping an opening of the organic insulating layer in a plan view and having a width greater than a width of the opening of the organic insulating layer; and a second portion integral with the first portion and having a width less than the width of the first portion, and the second portion of the auxiliary electrode is electrically connected to the auxiliary common voltage line through a contact hole penetrating through the organic insulating layer and the inorganic insulating layer.

30. A method of manufacturing a display device, the method comprising:

forming an organic insulating layer having an opening on a substrate;

forming a first electrode on the organic insulating layer;

forming an auxiliary electrode having a first portion overlapping the opening of the organic insulating layer in a plan view, on the organic insulating layer;

forming a bank layer including a first bank opening and a second bank opening, the first bank opening overlapping the first electrode in the plan view, and the second bank opening overlapping the first portion of the auxiliary electrode in the plan view;

forming an intermediate layer on the first electrode and the auxiliary electrode;

forming a hole of the intermediate layer in the opening of the organic insulating layer by irradiating a laser to the intermediate layer, the hole of the intermediate layer exposing a portion of the auxiliary electrode;

removing a portion of a first area of the intermediate layer around the hole of the intermediate layer and forming a second area of the intermediate layer to protrude by irradiating the laser to the intermediate layer, the second area being extended to the first area and within the opening of the organic insulating layer; and forming a second electrode on the intermediate layer to electrically contact the auxiliary electrode through the hole of the intermediate layer, wherein a third area of the intermediate layer is disposed at an outer edge of the second area and within the opening of the organic insulating layer, the third area having a third thickness that is uniform.

31. The method of claim 30, wherein an output per unit area of the laser is less than or equal to about 200 $mJ/cm^2$.

32. The method of claim 30, wherein the laser comprises an ultraviolet laser having a wavelength greater than or equal to about 300 nm and less than or equal to about 400 nm.

* * * * *